(12) United States Patent
Parekh et al.

(10) Patent No.: US 12,058,853 B2
(45) Date of Patent: Aug. 6, 2024

(54) ELECTRONIC DEVICES INCLUDING CAPACITORS AND RELATED METHODS

(71) Applicant: Micron Technology, Inc., Boise, ID (US)

(72) Inventors: Kunal R. Parekh, Boise, ID (US); Surendranath C. Eruvuru, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 761 days.

(21) Appl. No.: 17/115,469

(22) Filed: Dec. 8, 2020

(65) Prior Publication Data

US 2022/0181344 A1 Jun. 9, 2022

(51) Int. Cl.
| | | |
|---|---|---|
| H10B 41/27 | (2023.01) | |
| H01L 21/82 | (2006.01) | |
| H01L 21/8234 | (2006.01) | |
| H01L 27/06 | (2006.01) | |
| H01L 27/092 | (2006.01) | |
| H10B 43/27 | (2023.01) | |

(52) U.S. Cl.
CPC ..... *H10B 41/27* (2023.02); *H01L 21/823437* (2013.01); *H01L 27/0629* (2013.01); *H01L 27/0688* (2013.01); *H01L 27/092* (2013.01); *H10B 43/27* (2023.02)

(58) Field of Classification Search
CPC ............. H01L 27/0629; H01L 27/0688; H01L 27/092; H01L 21/823437; H10B 41/27; H10B 43/27
USPC .......................................................... 257/296
See application file for complete search history.

(56) References Cited

U.S. PATENT DOCUMENTS

| | | | |
|---|---|---|---|
| 6,620,672 B1 | 9/2003 | Dennison et al. | |
| 6,661,041 B2 | 12/2003 | Keeth | |
| 7,151,291 B2 | 12/2006 | Parekh et al. | |
| 7,205,600 B2 | 4/2007 | Agarwal et al. | |
| 7,298,650 B2 | 11/2007 | Khouri et al. | |
| 7,372,091 B2 | 5/2008 | Leslie | |
| 7,385,259 B2 | 6/2008 | Mouli | |
| 8,013,376 B2 | 9/2011 | Parekh | |
| 8,618,633 B2 | 12/2013 | El-Kareh | |
| 8,779,490 B2* | 7/2014 | Khan | H10B 12/0385 |
| | | | 438/386 |
| 8,859,425 B2 | 10/2014 | Parekh et al. | |
| 9,343,169 B2 | 5/2016 | Vali et al. | |
| 10,651,153 B2 | 5/2020 | Fastow et al. | |
| 2009/0168482 A1 | 7/2009 | Park et al. | |
| 2015/0001602 A1* | 1/2015 | Wu | H10B 12/482 |
| | | | 257/296 |

* cited by examiner

*Primary Examiner* — Monica D Harrison
(74) *Attorney, Agent, or Firm* — TraskBritt

(57) ABSTRACT

An electronic device includes one or more capacitors adjacent to a base material. The one or more capacitors comprise at least one electrode extending horizontally within the base material, and additional electrodes extending vertically within the base material and contacting the at least one electrode. The at least one electrode is located below and isolated from an upper surface of the base material. Additional electronic devices are disclosed, as are methods of forming an electronic device and related systems.

25 Claims, 10 Drawing Sheets

ELECTRONIC DEVICES INCLUDING CAPACITORS AND RELATED METHODS

TECHNICAL FIELD

Embodiments disclosed herein relate to electronic devices and electronic device fabrication. More particularly, embodiments of the disclosure relate to electronic devices including capacitors and to related methods and systems.

BACKGROUND

Electronic device designers often desire to increase the level of integration, which may also be characterized as density, of features within an electronic device by reducing the dimensions of the individual features and by reducing the distance between neighboring features. In addition, electronic device designers often desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as non-volatile memory devices (e.g., 3D NAND Flash memory devices), in which memory cells are positioned vertically on a substrate. In such memory devices, capacitors are used in various types of peripheral circuits such as charge pump circuits, sense amplifiers, page buffers, and the like. These capacitors are formed as metal-oxide semiconductor (MOS) capacitors or well capacitors above a base material (e.g., a semiconductor substrate) by the same process as that used to form transistors used in other circuits. Such memory devices may include one or more memory arrays, which may overlie a complementary metal-oxide-semiconductor (CMOS) region, such as a CMOS under array (CuA) region. The reliability and performance of integrated circuits may be affected by the quality of their interconnect structures. However, as the memory cells and associated capacitors are formed closer together and at smaller dimensions, it becomes increasingly difficult to increase capacitance within a given area and/or to reduce a footprint to optimize packing density.

DETAILED DESCRIPTION

Figure 1A:
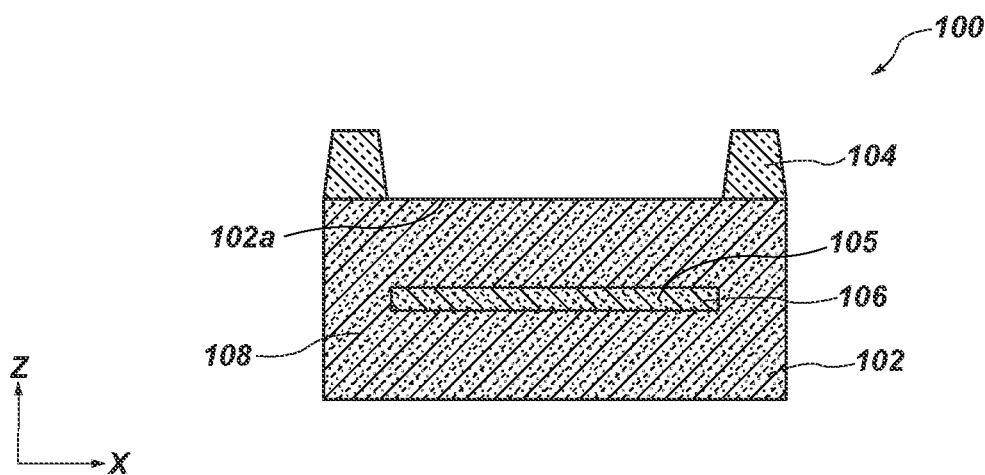
FIGS. 1A through 1E are cross-sectional views illustrating the formation of an electronic device including capacitors according to embodiments of the disclosure.

An electronic device (e.g., an apparatus, a semiconductor device, a memory device) that includes one or more capacitors is disclosed. The electronic device comprises one or more capacitors adjacent to a base material. The capacitors comprise at least one electrode (e.g., one or more lower electrodes) extending horizontally within the base material, and additional electrodes (e.g., within pillar regions) extending vertically within the base material and contacting the at least one electrode. The at least one electrode is located below and isolated from an upper surface of the base material. The capacitors also include an upper electrode overlying the upper surface of the base material. The upper electrode contacts the additional electrodes with a major surface of the upper electrode substantially transverse to a longitudinal axis of the additional electrodes. A combination of the upper electrode, the additional electrodes, and the at least one electrode function as a gate electrode of the capacitors. The at least one electrode of the gate electrode may be formed by forming a sacrificial material (e.g., a doped material) extending horizontally within the base material, removing the sacrificial material, and forming a conductive material of the gate electrode (e.g., the lower electrode) within regions of the base material vacated upon removal of the sacrificial material. In some embodiments, a width of the at least one lower electrode is relatively greater than a width of the upper electrode in a horizontal direction. The capacitors may be configured as so-called "buried," two-sided capacitors. At least some of the capacitors may be located within a page buffer region of a CMOS under array (CuA) region under at least one array of memory cells.

The capacitors may be configured as so-called "buried," two-sided capacitors. For example, since the at least one electrode extends horizontally within the base material and the additional electrodes extend vertically within the base material, first opposing surfaces of the base material flank the additional electrodes and second opposing surfaces of the base material flank the at least one electrode, with the second opposing surfaces of the base material substantially orthogonal to the first opposing surfaces of the base material. By providing the capacitors including the orthogonal arrangement of the two-sided regions within the base material, as well as the differing (e.g., horizontal and vertical) orientation of the individual regions of the gate electrode within the base material of the electronic device, such configurations may allow for improved (e.g., increased) capacitance in the capacitors within a given footprint, which improved capacitance may result in either an increased capacitance for a given area or a reduced area allocated for the capacitors. Such a configuration may result in an increased capacitance within a given area during use and operation of the electronic device without the need to increase the footprint of the capacitors.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, the term "dielectric material" means and includes an electrically insulative material. The dielectric material may include, but is not limited to, one or more of an insulative oxide material or an insulative nitride material. The insulative oxide may be a silicon oxide material, a metal oxide material, or a combination thereof. The insulative oxide may include, but is not limited to, a silicon oxide ($SiO_x$, silicon dioxide ($SiO_2$)), phosphosilicate glass, borosilicate glass, borophosphosilicate glass, fluorosilicate glass, aluminum oxide (AlO$_x$), gadolinium oxide (GdO$_x$), hafnium oxide (HfO$_x$), magnesium oxide (MgO$_x$), niobium oxide (NbO$_x$), tantalum oxide (TaO$_x$), titanium oxide (TiO$_x$), zirconium oxide (ZrO$_x$), hafnium silicate, a dielectric oxynitride material (e.g., SiO$_x$N$_y$), a dielectric carboxynitride material (e.g., SiO$_x$C$_z$N$_y$), a combination thereof, or a combination of one or more of the listed materials with silicon oxide. The insulative nitride material may include, but is not limited to, silicon nitride.

As used herein, the term "configured" refers to a size, shape, material composition, and arrangement of one or more of at least one structure and at least one apparatus facilitating operation of one or more of the structure and the apparatus in a pre-determined way.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1F illustrate a method of forming an electronic device including capacitors, at various stages of the method, according to embodiments of this disclosure. For simplicity, the formation of a single device structure is illustrated, but it will be understood by one of ordinary skill in the art that the method includes simultaneously forming multiple (e.g., more than one, an array of) electronic devices. For convenience in describing FIGS. 1A through 1F, a first direction may be defined as the X-direction and a second direction, which is transverse (e.g., perpendicular) to the first direction, as the Y-direction. A third direction, which is transverse (e.g., perpendicular) to each of the first direction and the second direction, may be defined as the Z-direction. Similar directions are defined, as shown in FIGS. 2A through 6, as discussed in greater detail below.

A method of forming an electronic device 100 that includes one or more capacitors 130 (see FIG. 1E) is shown in FIGS. 1A through 1F. The electronic device 100 includes a base material 102 (e.g., a semiconductive material, a substrate), a mask material 104, a sacrificial material 105 of a doped region 106, and an undoped region 108 of the base material 102. As shown in FIG. 1A, the mask material 104 (e.g., a mask or a resist material) may, optionally, be placed adjacent to (e.g., on or over) an upper surface 102a of the base material 102. The mask material 104 may be formed of and include at least one of amorphous carbon, silicon, a silicon oxide, a silicon nitride, a silicon oxycarbide, aluminum oxide, and a silicon oxynitride. In some embodiments, the mask material 104 is formed of and includes at least one dielectric oxide material (e.g., one or more of silicon dioxide and aluminum oxide). In other embodiments, the mask material 104 is formed of and includes silicon nitride. The mask material 104 may be homogeneous (e.g., may include a single material), or may be heterogeneous (e.g., may include a stack including at least two different materials). The mask material 104 may be formed using conventional processes and patterned using conventional patterning and material removal processes, such as conventional photolithographic exposure processes, conventional development processes, conventional etching processes and conventional processing equipment, which are not described in detail herein.

Following formation of the mask material 104, selected portions of the base material 102 may be doped (e.g., implanted) with one or more dopants (e.g., chemical species) to form the doped region 106 within the undoped region 108 (e.g., a less-doped or substantially undoped material) of the base material 102. In some embodiments, the dopants are dispersed in a region a selected distance below and distal from the upper surface 102a of the base material 102, and the dopants are dispersed only partially through (e.g., less than completely through) the height (e.g., in the Z-direction) of the base material 102. For example, as shown in FIG. 1A, the base material 102 may include horizontal extending portions of the doped region 106, and the undoped region 108 horizontally adjacent to (e.g., laterally adjacent to) the doped region 106. In other words, at least portions of the undoped region 108 may be in vertical alignment with (e.g., shielded by) the mask material 104. Additional portions of the undoped region 108 may be vertically adjacent to (e.g., vertically overlying, vertically underlying) the doped region 106. Accordingly, the doped region 106 may be substantially (e.g., entirely) surrounded by the undoped region 108 of the base material 102.

The base material 102 may be doped with at least one dopant to form the sacrificial material 105 of the doped region 106 using conventional processes (e.g., conventional implantation processes, conventional diffusion processes). As a non-limiting example, at least one n-type dopant, such as one or more of phosphorus, arsenic, antimony, and bismuth, may be implanted into a desired portion of the base material 102 to form the doped region 106. As another non-limiting example, at least one p-type dopant, such as one or more of boron, aluminum, and gallium, may be implanted into the desired portion of the base material 102 to form the doped region 106. As yet another non-limiting example, the dopant may include one or more of carbon, fluorine, chlorine, bromine, hydrogen, deuterium, helium, neon, and argon. In some embodiments, hydrogen is used as the dopant, forming the doped region 106 implanted with hydrogen. The doped region 106 may be doped to a sufficient extent to provide etch selectivity between the doped region 106 and undoped region 108 of the base material 102.

After the dopant implantation, an annealing act may, for example, be conducted to diffuse the dopant into the doped region 106. For example, the base material 102 including the at least one dopant may be annealed (e.g., thermally annealed, laser annealed) to form the doped region 106 within the base material 102. By forming the doped region 106, the sacrificial material 105 may be selectively removable (e.g., selectively etchable) relative to the material of the undoped region 108. Following formation of the sacrificial material 105 of the doped region 106, the mask material 104, if present, may be removed.

Figure 1B:
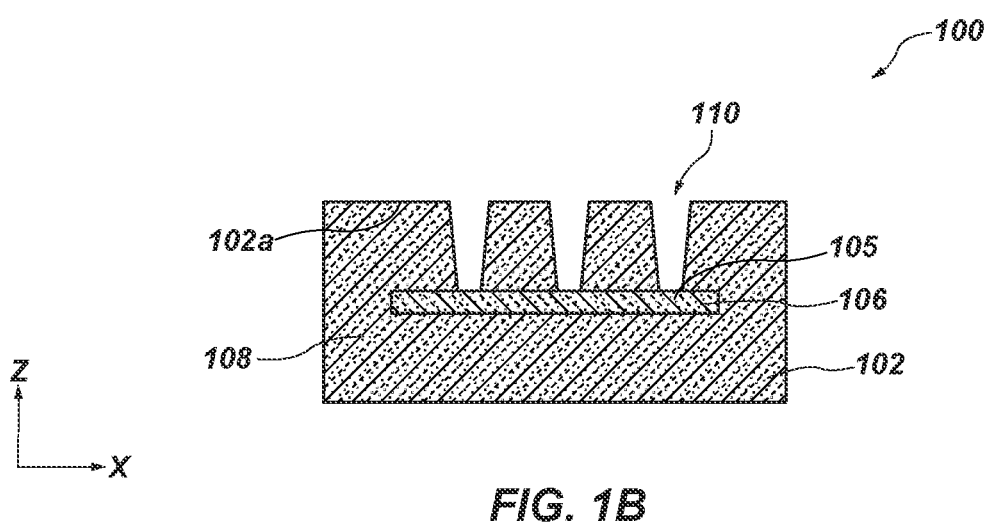

Openings 110 (e.g., access points) are formed in the base material 102, as shown in FIG. 1B. The openings 110 may be adjacent to (e.g., over) the doped region 106, exposing a desired portion of the doped region 106, and may extend through the undoped region 108 of the base material 102. The openings 110 may be formed by conventional techniques. While FIG. 1B illustrates three openings 110, more than three openings 110 may be present. The openings 110 correspond to locations where pillar regions 124 (e.g., additional electrodes) of a gate electrode 120 (see FIG. 1E) are ultimately to be formed. In some embodiments, the openings 110 may extend from the upper surface 102a of the base material 102 to an upper surface of the doped region 106, as shown in FIG. 1B. In other embodiments, at least some of the openings 110 may extend through the doped region 106 and into a lower portion of the base material 102. In yet other embodiments, alternative access points may be provided to expose a portion of the sacrificial material 105 within the doped region 106. For example, one or more lateral side openings (not shown) may be formed to provide access to the sacrificial material 105 of the doped region 106, although other configurations may be contemplated. Dimensions of the openings 110 may be selected to expose a desired surface area of the undoped region 108 of the base material 102. By way of non-limiting example, a height of the openings 110 may be within a range of from about 200 nanometers (nm) to about 1000 nm (1 μm), such as within a range of from about 200 nm to about 400 nm, from about 400 nm to about 600 nm, from about 600 nm to about 800 nm, or from about 800 nm to about 1000 nm. In some embodiments, the openings 110 have an aspect ratio (e.g., a high aspect ratio (HAR)) within a range of from about 5:1 to about 40:1, such as between about 5:1 and about 10:1, between about 10:1 and about 20:1, or between about 20:1 and about 40:1. In other embodiments, the openings 110 have an aspect ratio within a range of from about 2:1 to about 5:1, such as between about 3:1 and about 5:1. The aspect ratio of the openings 110 may be tailored to have a desired value that may be selected at least partially based on design requirements of the electronic device 100.

Figure 1C:
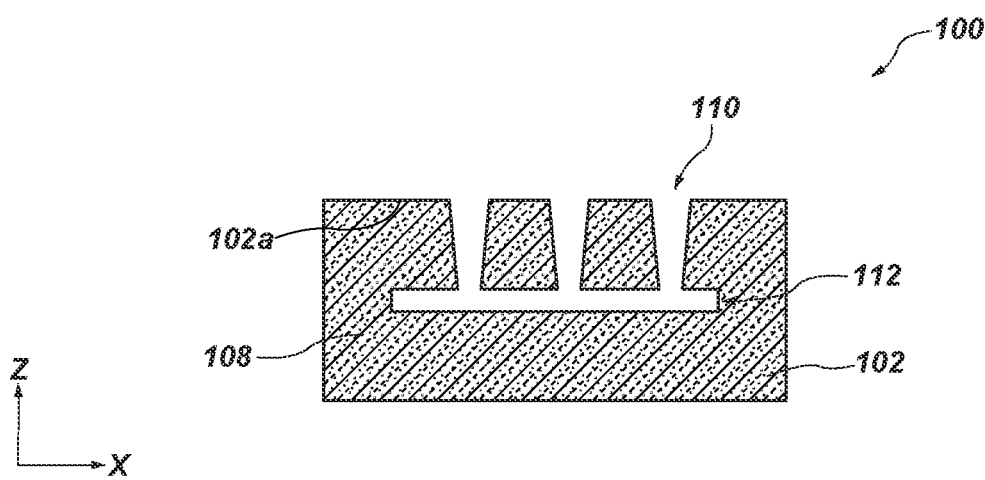

Referring to FIG. 1C, the sacrificial material 105 of the doped region 106 (FIG. 1B) may be substantially removed through the openings 110 extending vertically through the base material 102 to form openings 112, which extend laterally within the base material 102. Removing the sacrificial material 105 may expose horizontally extending surfaces of the undoped region 108 of the base material 102 previously directly adjacent to the sacrificial material 105 of the doped region 106 within the openings 112. The openings 112 correspond to locations where a lower electrode 126 of the gate electrode 120 (see FIG. 1E) is ultimately to be formed. By way of non-limiting example, the sacrificial material 105 of the doped region 106 may be selectively removed by exposing the sacrificial material 105 to at least one wet etchant comprising one or more of phosphoric acid, sulfuric acid, acetic acid, nitric acid, hydrochloric acid, aqua regia, hydrogen peroxide, or another etch chemistry. In some embodiments, the sacrificial material 105 is removed using a phosphoric-acetic-nitric acid (PAN) etchant. However, the disclosure is not so limited and the sacrificial material 105 of the doped region 106 may be removed with other etchants and/or material removal processes (e.g., vapor phase removal processes, atomic layer removal processes). In some embodiments, the sacrificial material 105 of the doped region 106 is removed by exposure to one or more dry etchants, such as one or more chlorine-containing dry etchants. By way of non-limiting example, the one or more dry etchants may include one or more of chlorine gas, boron trichloride ($BCL_3$), oxygen, and argon. In some embodiments, the sacrificial material 105 of the doped region 106 is selectively removed by exposure to a dry etchant comprising chlorine gas and boron trichloride. The sacrificial material 105 of the doped region 106 (FIG. 1B) may be removed (e.g., substantially entirely removed) such that the electronic device 100 is substantially devoid (e.g., substantially absent) of the sacrificial material 105 of the doped region 106. In other embodiments, a portion of the sacrificial material 105 of the doped region 106 may remain within (e.g., along a perimeter of) one or more of the openings 110 and the openings 112. In some instances, a portion of the undoped region 108 exposed following the removal of the sacrificial material 105 may also be removed such that a final dimension (e.g., final height, final width) of one or more of the openings 110 and the openings 112 is relatively greater than an initial dimension (e.g., initial height, initial width) of the openings 110 and the openings 112.

Figure 1D:
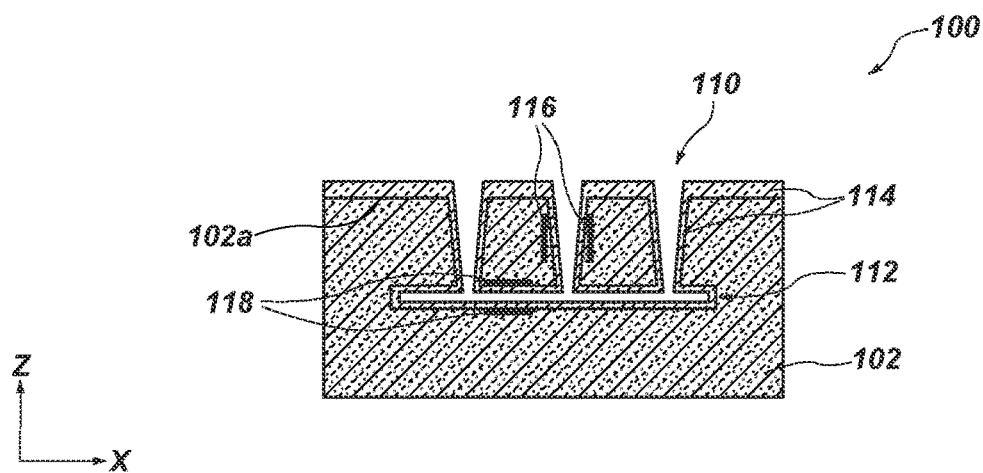

As shown in FIG. 1D, after removal of the sacrificial material 105 of the doped region 106 (FIG. 1B), a dielectric material 114 (e.g., a gate dielectric) may be formed within the openings 110 and the openings 112 and over exposed upper surfaces and side surfaces of the base material 102. For example, the dielectric material 114 may be formed adjacent to (e.g., on or over) the upper surface 102a of the base material 102 external to the openings 110. The dielectric material 114 may also be formed adjacent to (e.g., under, over) exposed surfaces (e.g., upper surfaces, lower surfaces) of the base material 102 and laterally adjacent to sidewalls of the base material 102 within the openings 110 and the openings 112. In other words, the dielectric material 114 may substantially entirely cover exposed surfaces of the base material 102 within each of the openings 110 and the openings 112. In some embodiments, the dielectric material 114 is formed directly adjacent to the exposed surfaces of the base material 102 without being formed in a central portion of the openings 110 and the openings 112. In some embodiments, the dielectric material 114 is a high quality silicon oxide material, such as an ALD $SiO_x$. For example, a highly uniform and highly conformal silicon oxide material (e.g., a highly uniform and highly conformal silicon dioxide material) may be used so that voids do not form within the openings 110, 112. In particular, the dielectric material 114 may be formulated to be formed in high aspect ratio (HAR) openings, such as those having a HAR of at least about 20:1, at least about 50:1, at least about 100:1, or at least about 1000:1, without forming voids. By way of non-limiting example, a thickness of the dielectric material 114 may be within a range of from about 3 nm to about 30 nm, such as within a range of from about 3 nm to about 5 nm, from about 5 nm to about 10 nm, from about 10 nm to about 20 nm, or from about 20 nm to about 30 nm. The dielectric material 114 may be formed using one or more conformal deposition processes, such as one or more of a conventional conformal CVD process or a conventional ALD process.

Figure 1E:
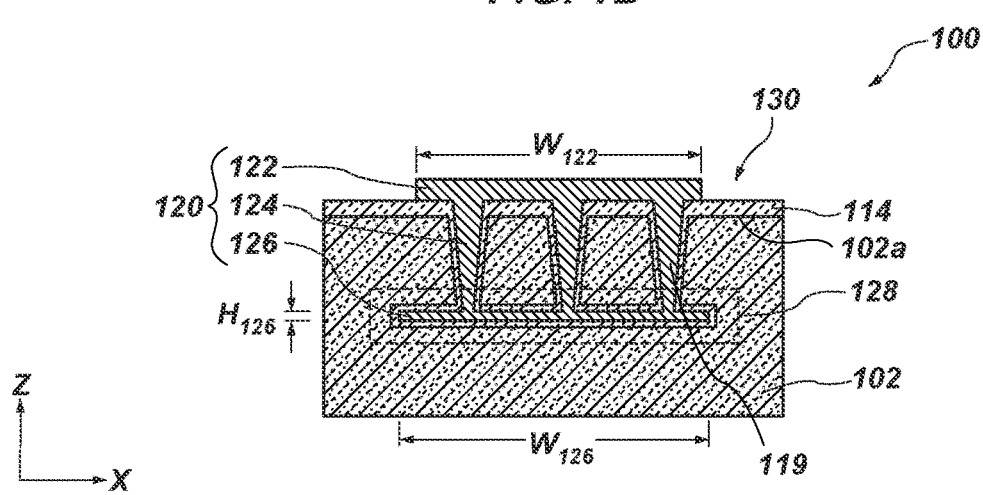

Still referring to FIG. 1D, exposing surfaces of the base material 102 on opposing surfaces within the openings 110 facilitates formation of first opposing surfaces 116 of the base material 102 adjacent to (e.g., horizontally adjacent to) opposing sides of the openings 110 and extending in a vertical direction (e.g., the Z-direction). Exposing surfaces of the base material 102 on opposing surfaces within the openings 112 facilitates formation of second opposing surfaces 118 of the base material 102 adjacent to (e.g., vertically adjacent to) opposing sides of the openings 112 and extending in a horizontal direction (e.g., the X-direction). In other words, the first opposing surfaces 116 and the second opposing surfaces 118 are defined, for illustrative purposes only, as surfaces of the base material 102 directly adjacent to the dielectric material 114 within the openings 110 and the openings 112, respectively. Formation of the first opposing surfaces 116 of the base material 102 extending in the vertical direction and the second opposing surfaces 118 of the base material 102 extending in the horizontal direction and orthogonal to the first opposing surfaces 116 provides a greater surface area of the base material 102 within a given area for subsequently formed capacitors within the base material 102, as described in greater detail below. Since the first opposing surfaces 116 of the base material 102 flank the openings 110, two-sided (e.g., opposing) regions are formed within the base material 102. Similarly, since the second opposing surfaces 118 of the base material 102 flank the openings 112, two-sided (e.g., opposing) regions are formed within the base material 102. Forming such two-sided regions within the base material 102 enhances (e.g., increases) an available surface area having more than one side (e.g., two opposing sides) within the base material 102 in which to form the capacitors 130 (FIG. 1E). Further, the vertical orientation of the first opposing surfaces 116 relative to the upper surface 102a of the base material 102, in combination with the horizontal orientation of the second opposing surfaces 118 below and isolated from the upper surface 102a of the base material 102, facilitates formation of multidimensional (e.g., two-dimensional) regions between the openings 110 and the openings 112 within the base material 102, as shown in FIG. 1D.

As shown in FIG. 1E, a conductive material 119 of the gate electrode 120 is formed in the openings 110 (FIG. 1D) and the openings 112 (FIG. 1D) to form the capacitors 130. The conductive material 119 of the gate electrode 120 may be formed of and include polysilicon. In some embodiments, the conductive material 119 of the gate electrode 120 is n-doped polysilicon, p-doped polysilicon, or undoped polysilicon. In other embodiments, the conductive material 119 of the gate electrode 120 may be formed of and include a tungsten-containing material or other conductive metal. The gate electrode 120 may be formed to include individual portions including an upper electrode 122, the pillar regions 124, and the lower electrode 126. The upper electrode 122 is formed adjacent to (e.g., over) the dielectric material 114 overlying the upper surface of base material 102 external to the openings 110, with a major surface of the upper electrode 122 being substantially parallel to the upper surface 102a of the base material 102. The pillar regions 124 are formed adjacent to the dielectric material 114 within the openings 110 with a longitudinal axis of the pillar regions 124 extending vertically through the base material 102 and substantially transverse to the major surface of the upper electrode 122. The lower electrode 126 is formed adjacent to the dielectric material 114 within the openings 112 with a major surface of the lower electrode 126 being substantially parallel with a major surface of the upper electrode 122. A material of the upper electrode 122 may be the same as or different than a material of one or more of the pillar regions 124 and the lower electrode 126. For convenience, the upper electrode 122, the pillar regions 124, and the lower electrode 126 are shown in the drawings as individual portions of the gate electrode 120, although it is understood that the gate electrode 120 includes a substantially continuous portion of one or more (e.g., a single) conductive material, in some embodiments. As used herein, the term "continuous" means and includes a material having substantially no interruptions, such as voids, gaps, pinholes, or other openings, therein. Accordingly, in some embodiments, one or more of the upper electrode 122, the pillar regions 124, and the lower electrode 126 may include substantially the same chemical composition with no easily discernable physical interface therebetween. In other embodiments, one or more of the upper electrode 122, the pillar regions 124, and the lower electrode 126 may be formed from and include a chemical composition that differs from one or more other portions of the gate electrode 120.

The dielectric material 114 may substantially entirely surround the gate electrode 120 within the openings 110, 112 such that the individual portions of the gate electrode 120 (e.g., the upper electrode 122, the pillar regions 124, the lower electrode 126) may be electrically and physically isolated from the base material 102 by the dielectric material 114. In some embodiments, the dielectric material 114 includes a substantially continuous portion of one or more (e.g., a single) material. The gate electrode 120 may be formed (e.g., conformally formed) in each of the openings 110 (FIG. 1D) and the openings 112 (FIG. 1D) by conventional techniques. In some embodiments, the gate electrode 120 may substantially fill (e.g., substantially completely fill) each of the openings 110 and the openings 112. In other embodiments, at least some of the pillar regions 124 of the gate electrode 120 may include one or more additional materials (e.g., insulative materials, support structures) within a central portion of the openings 110 such that the pillar regions 124 function as mechanical support pillars, as described in greater detail with reference to FIG. 4C. In FIG. 1E, the pillar regions 124 of the gate electrode 120 in the openings 110 are adjacent to (e.g., over) the top portion of the lower electrode 126 within the openings 112. Therefore, the pillar regions 124 directly contact the lateral portion of the lower electrode 126, as shown in FIG. 1E. In other embodiments, at least some of the pillar regions 124 may extend vertically through the lower electrode 126 and into a lower portion of the base material 102. The upper electrode 122 is adjacent to (e.g., over) the top portions of the pillar regions 124 and directly contacts the pillar regions 124. In some embodiments, each of the upper electrode 122, the pillar regions 124, and the lower electrode 126 of the gate electrode 120 may be formed using a single deposition act. In other embodiments, one or more individual portions of the gate electrode 120 (e.g., the upper electrode 122) may be formed following formation of one or more other portions (e.g., the pillar regions 124, the lower electrode 126) of the gate electrode 120. Excess material of the upper electrode 122 may be removed, as shown in FIG. 1E, forming the gate electrode 120 within each of the openings 110 and the openings 112 and adjacent to (e.g., over) the upper surface 102a of the base material 102.

As shown in FIG. 1E, the upper electrode 122 of the gate electrode 120 may be formed to have a width $W_{122}$ (e.g., a horizontal dimension in the X-direction), and the lower electrode 126 of the gate electrode 120 may be formed to have a width $W_{126}$ that differs from the width $W_{122}$ of the upper electrode 122. For example, the width $W_{126}$ of the lower electrode 126 may be relatively greater than the width $W_{122}$ of the upper electrode 122, such that a surface area of the gate electrode 120 within the base material 102 is greater than a surface area of the gate electrode 120 external to (e.g., adjacent to and overlying the upper surface 102a) of the base material 102. In other words, a ratio of $W_{122}:W_{126}$ is less than 1.0. By way of non-limiting example, the ratio of the width $W_{122}$ of the upper electrode 122 and the width $W_{126}$ of the lower electrode 126 may be between about 0.3 and about 0.9, such as between about 0.4 and about 0.7. Accordingly, at least one lateral end of the upper electrode 122 may be laterally offset from (e.g., not aligned with) at least one lateral end of the lower electrode 126. In some embodiments, each lateral end of the upper electrode 122 may be laterally offset from each lateral end of the lower electrode 126, as shown in FIG. 1E. In other embodiments, the width $W_{122}$ of the upper electrode 122 may be substantially equal to the width $W_{126}$ of the lower electrode 126 such that lateral centers of the upper electrode 122 and the lower electrode 126 are substantially laterally aligned with one another and each lateral end of the upper electrode 122 is substantially laterally aligned with a lateral end of the lower electrode 126 most proximate thereto. The lower electrode 126 may be formed to have a height $H_{126}$ extending between opposing surfaces of the dielectric material 114 within the openings 112 (FIG. 1D). By way of non-limiting example, the height $H_{126}$ of the lower electrode 126 may be within a range of from about 30 nm to about 200 nm, such as from about 30 nm to about 40 nm, from about 40 nm to about 50 nm, from about 50 nm to about 60 nm, from about 60 nm to about 100 nm, or from about 100 nm to about 200 nm.

Formation of the gate electrode 120 results in formation of one or more capacitors 130 within the base material 102. The capacitors 130 may be characterized as so-called "buried capacitors" since the lower electrode 126 and the pillar regions 124 of the gate electrode 120 are formed within the base material 102 (e.g., below the upper surface 102a thereof). The capacitors 130 may be characterized as so-called "two-sided capacitors" since the first opposing surfaces 116 (FIG. 1D) and the second opposing surfaces 118 (FIG. 1D) of the base material 102 flank the pillar regions 124 and the lower electrode 126, respectively, of the gate electrode 120. Further, the vertical orientation of the pillar regions 124 of the gate electrode 120 relative to the upper surface 102a of the base material 102, in combination with the horizontal orientation of the lower electrode 126 of the gate electrode 120 below and isolated from the upper surface 102a of the base material 102 results in the multidimensional regions (e.g., two-dimensional regions) of the base material 102 adjacent to the individual regions of the gate electrode 120. Such an arrangement provides a greater surface area between the gate electrode 120 and the base material 102 to form opposing capacitor plates of the capacitors 130. Accordingly, the capacitors 130 include a region 128 (e.g., an additional capacitance region) indicated by the dashed line of the lower electrode 126 below and isolated from the upper surface 102a and extending within the base material 102 in addition to a capacitance region of the upper electrode 122 above the upper surface 102a of the base material 102, as shown in FIG. 1E. In some embodiments, the region 128 may include source/drain regions (not shown) formed in the base material 102 in regions proximal to the capacitors 130. In other words, the presence of the pillar regions 124 and the lower electrode 126, in addition to the upper electrode 122, provides additional capacitance (e.g., storage node) regions compared to conventional electronic devices including conventional capacitors (e.g., planar capacitors) having one electrode (e.g., a single upper electrode) external to (e.g. overlying) another electrode of a base material and extending in a single direction (e.g., the horizontal direction).

Figure 1F:
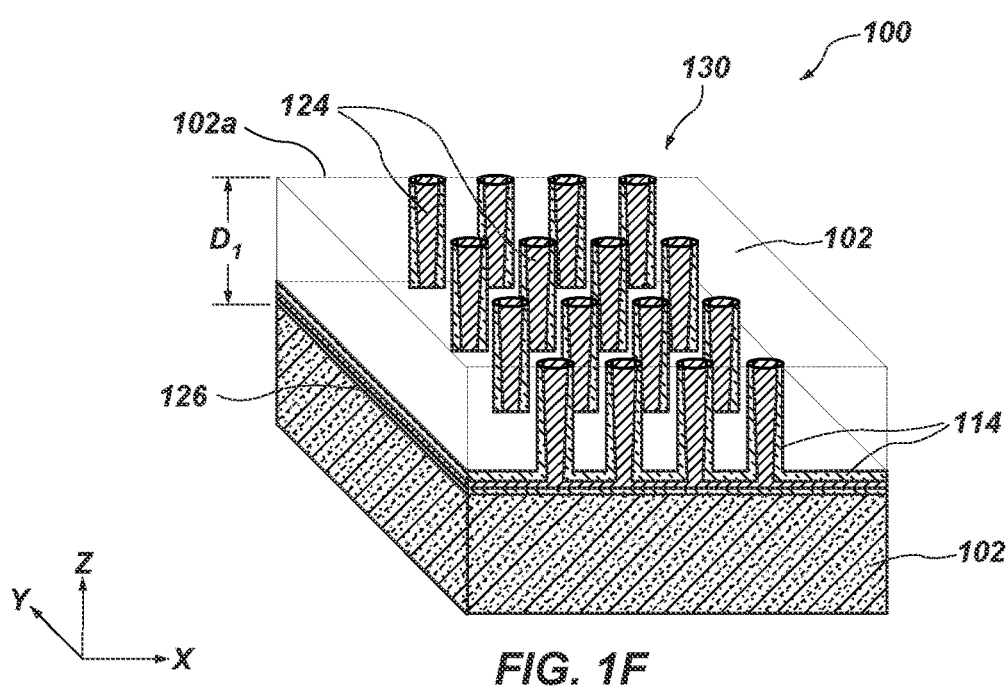
FIG. 1F is a perspective view of the electronic device of FIGS. 1A through 1E according to embodiments of the disclosure.

FIG. 1F is a perspective view of the electronic device 100 of FIGS. 1A through 1E. For simplicity, the upper electrode 122 is not shown in the perspective view of FIG. 1F. As discussed above, the gate electrode 120 includes individual regions including the upper electrode 122, the pillar regions 124, and the lower electrode 126, each of which are substantially continuous materials extending in the horizontal direction (e.g., the upper electrode 122, the lower electrode 126) and in the vertical direction (e.g., the pillar regions 124). As best shown in the perspective view of FIG. 1F, the lower electrode 126 extends in a first horizontal direction (e.g., the X-direction) and in a second horizontal direction (e.g., the Y-direction). The upper electrode 122 also extends in the first horizontal direction (e.g., the X-direction) and in the second horizontal direction (e.g., the Y-direction). Upper surfaces of the upper electrode 122 may be substantially parallel with lower surfaces of the upper electrode 122, and upper surfaces of the lower electrode 126 may be substantially parallel with lower surfaces of the lower electrode 126. In addition, the upper electrode 122 and the lower electrode 126 may be substantially parallel with one another.

The gate electrode 120 may be electrically and physically isolated from the base material 102 by the dielectric material 114. Outer side surfaces (e.g., sidewalls) of the pillar regions 124 of the gate electrode 120 may exhibit a tapered profile with an upper portion of individual pillar regions 124 having a greater critical dimension (e.g., width) than a lower portion thereof, as shown in FIG. 1F. In other embodiments, the pillar regions 124 have a different profile, for example, a substantially orthogonal (e.g., substantially rectangular) profile, a dish-shaped profile, or any other three-dimensional recess shape. Dimensions of the pillar regions 124 may be selected depending on desired electrical performance characteristics of the electronic device 100 containing the capacitors 130. For example, dimensions (e.g., height, width) of the pillar regions 124 may be selected responsive to a desired surface area of regions of the base material 102 between neighboring pillar regions 124. Each of the pillar regions 124 may be formed at substantially the same pitch and exhibit substantially the same critical dimension (CD) as one another. The pitch of the pillar regions 124 may be within a range of from about 20 nm to about 200 nm, such as from about 20 nm to about 40 nm, from about 40 nm to about 60 nm, from about 60 nm to about 100 nm, from about 100 nm to about 150 nm, or from about 150 nm to about 200 nm. As shown most clearly in FIG. 1F, the pillar regions 124 are equally spaced from one another in the first horizontal direction and the second horizontal direction, and spaces between the laterally adjacent pillar regions 124 exhibit substantially the same dimensions as one another. However, the CD of the pillar regions 124 may be different than the CD of the spaces between the pillar regions 124, as best shown in FIG. 1E. In other embodiments, at least some of the pillar regions 124 may not be equally spaced from one another and spaces between the laterally adjacent pillar regions 124 may not exhibit substantially the same dimensions as one another, such that at least some of the spaces between the laterally adjacent pillar regions 124 may vary (e.g., differ) from one another. In yet other embodiments, the pillar regions 124 are configured in a staggered (e.g., alternating) configuration. A first depth $D_1$ may correspond to a distance (e.g., in the Z-direction) between the upper surface 102a of the base material 102 and an upper surface of the lower electrode 126. In some embodiments, a vertical dimension (e.g., height) of the pillar regions 124 may correspond to the first depth $D_1$. By way of non-limiting example, the first depth $D_1$ may be within a range of from about 200 nm to about 1000 nm (1 μm), such as within a range of from about 200 nm to about 400 nm, from about 400 nm to about 600 nm, from about 600 nm to about 800 nm, or from about 800 nm to about 1000 nm. In some embodiments, the first depth $D_1$ may be about 300 nm.

While FIGS. 1A through 1F illustrate formation of only one (e.g., a single) doped region 106, more than one of the doped regions 106 may be formed. For example, two or more of the doped regions 106 (e.g., multilevel doped regions 106) may be formed in the base material 102 of an electronic device 100'. A method of forming multiple doped regions 106 within the base material 102 of the electronic device 100' is shown in FIGS. 2A through 2F. As shown, for example, in FIG. 2A, two doped regions 106 may be formed within the base material 102. The mask material 104, if present, and the doped regions 106 may be formed as described above for FIG. 1A. Each of the doped regions 106 may be substantially parallel with one another and separated from one another by the undoped region 108 of the base material 102. Responsive to placement of the mask material 104, lateral centers of each of the doped regions 106 may be substantially laterally aligned with one another such that each lateral end of the doped regions 106 is substantially aligned with a lateral end of each of the other doped regions 106 most proximate thereto. In other embodiments, multiple (e.g., three or more) of the doped regions 106 may be formed within the base material 102. In embodiments including multiple regions of the doped regions 106, the doped regions 106 may or may not be substantially equally spaced from one another. Each of the individual doped regions 106 may be below and isolated from the upper surface 102a of the base material 102 and substantially (e.g., entirely) surrounded by the undoped region 108. In other words, the undoped region 108 may vertically intervene between neighboring regions of the doped regions 106.

Figure 2A:
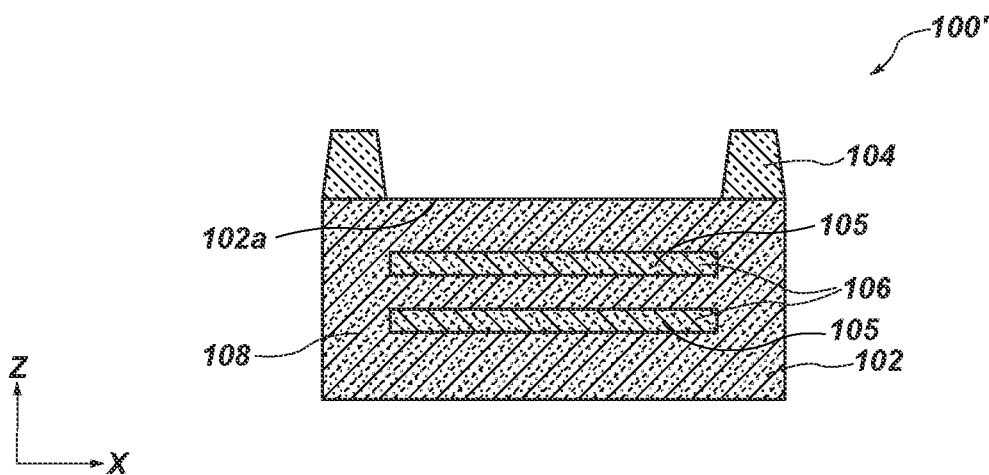
FIGS. 2A through 2E are cross-sectional views illustrating the formation of an electronic device including capacitors according to other embodiments of the disclosure.
Figure 2B:
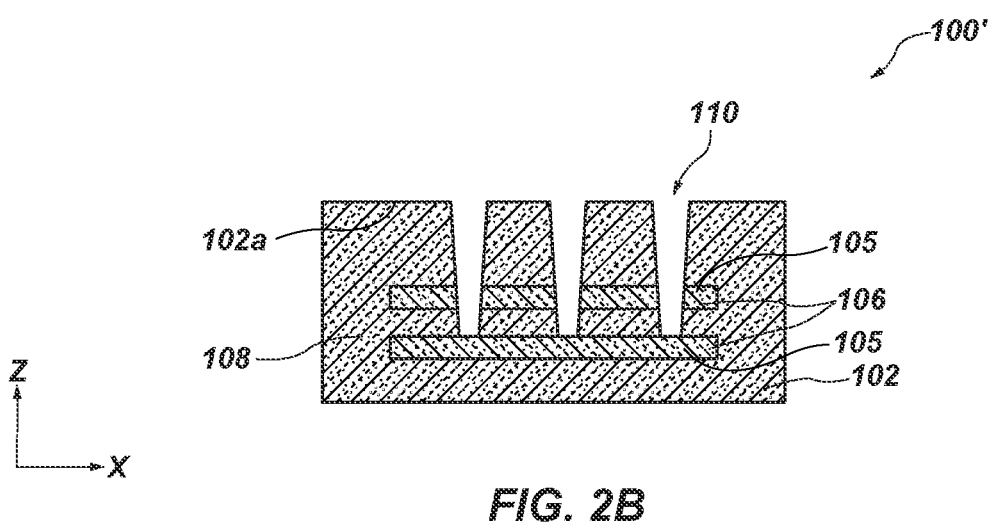

The openings 110 may be formed through the undoped region 108 of the base material 102 to expose each of the doped regions 106, as shown in FIG. 2B. The openings 110 may be formed as described above for FIG. 1B. The openings 110 may be adjacent to (e.g., over) each of the doped regions 106, exposing a desired portion of the individual doped regions 106, and may extend through the undoped region 108 of the base material 102. The openings 110 may extend through upper regions (e.g., a first doped region) of the doped regions 106 in order to expose desired portions of underlying regions (e.g., a second doped region) underlying the upper regions of the doped regions 106, as shown in FIG. 2B.

Figure 2C:
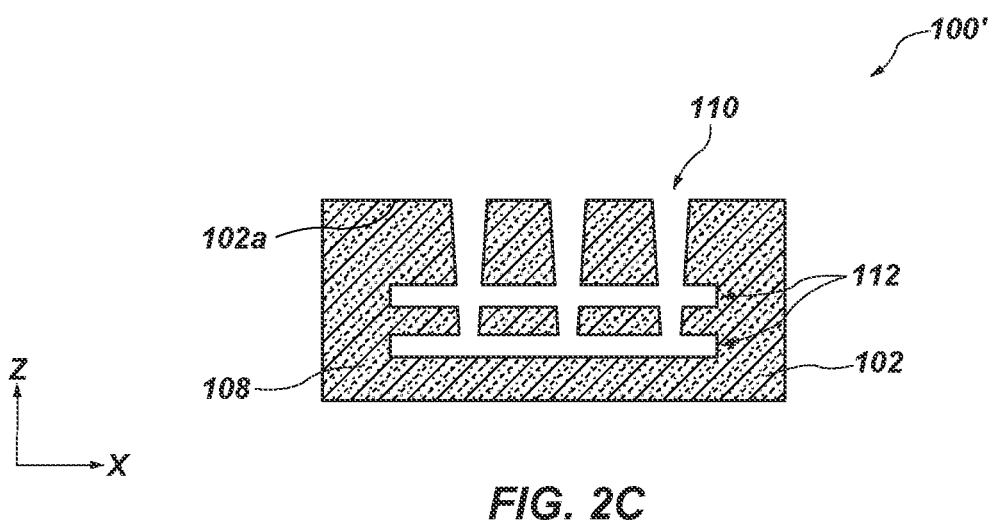

As shown in FIG. 2C, the sacrificial material 105 of the doped regions 106 (FIG. 2B) may be substantially removed to form two or more of the openings 112. Accordingly, the sacrificial material 105 of the horizontally extending portions of each of the doped regions 106 may be substantially removed to expose horizontally extending surfaces of the undoped region 108 of the base material 102 previously directly adjacent to the sacrificial material 105 of the individual doped regions 106 within the respective openings 112. The sacrificial material 105 of the doped regions 106 may be selectively removed as described above for FIG. 1C.

Figure 2D:
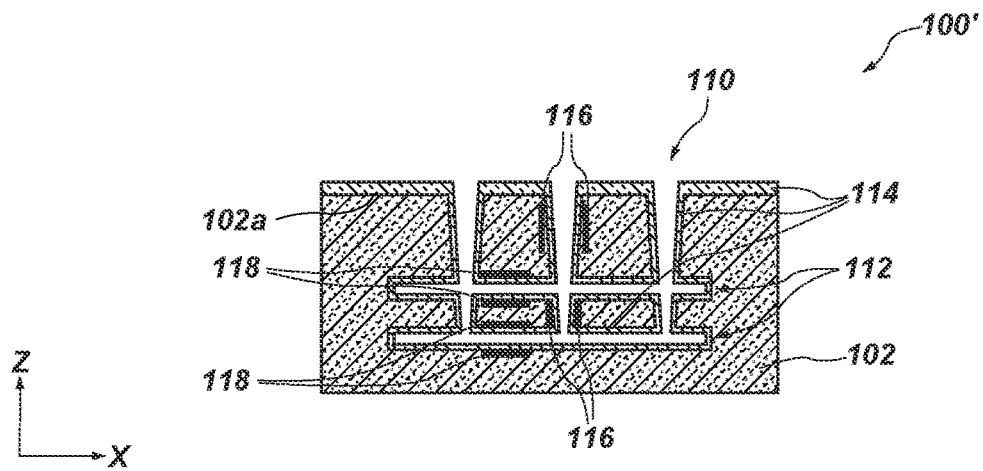

After removal of the sacrificial material 105 of the doped region 106 (FIG. 2B), the dielectric material 114 may be formed within the openings 110 and the openings 112 and over exposed upper surfaces and side surfaces of the base material 102, as shown in FIG. 2D. The dielectric material 114 may be formed adjacent to the upper surface 102a of the base material 102 external to the openings 110. The dielectric material 114 may also be formed adjacent to exposed surfaces and sidewalls of the base material 102 within each of the openings 110 and two or more of the openings 112. In other words, the dielectric material 114 may substantially entirely cover exposed surfaces of the base material 102 within each of the openings 110 and the openings 112 within the electronic device 100'. As described in greater detail with reference to FIG. 1D, formation of the first opposing surfaces 116 of the base material 102 extending in the vertical direction and the second opposing surfaces 118 of the base material 102 extending in the horizontal direction and orthogonal to the first opposing surfaces 116 provides a greater surface area for formation of subsequently formed capacitors within the base material 102. However, in the embodiment of FIG. 2D, two or more portions of the first opposing surfaces 116 and the second opposing surfaces 118 may be formed in the base material 102. Accordingly, additional two-sided (e.g., opposing) regions and additional multidimensional (e.g., two-dimensional) regions may be formed between the openings 110 and two or more of the openings 112 within the base material 102, as shown in FIG. 2D. Forming additional two-sided regions and additional two-dimensional regions within the base material 102 further enhances (e.g., further increases) an available area having more than one side (e.g., two sides) within the base material 102 in which to form the capacitors 130 (FIG. 2E).

Figure 2E:
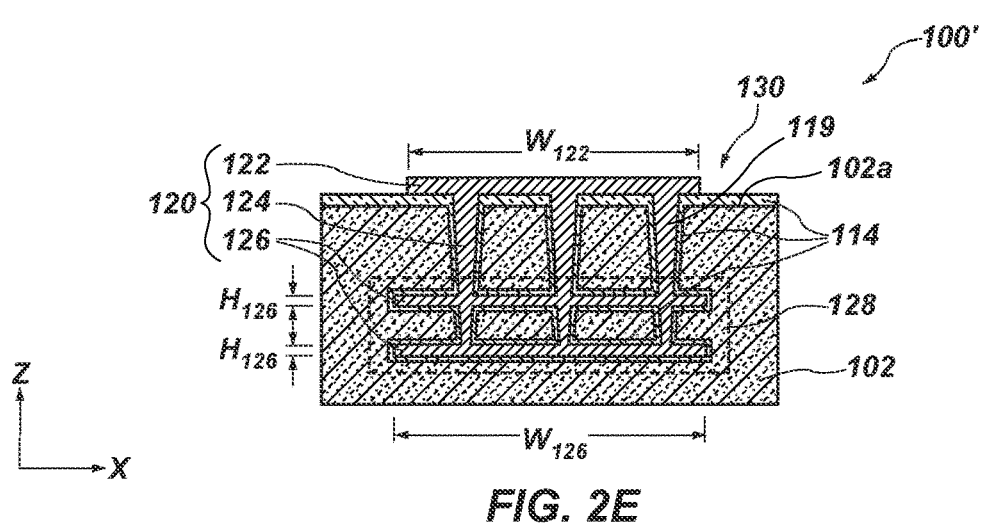

As shown in FIG. 2E, the conductive material 119 of the gate electrode 120 is formed in each of the openings 110 (FIG. 2D) and the openings 112 (FIG. 2D) to form the capacitors 130. The gate electrode 120, including the upper electrode 122, the pillar regions 124, and two or more of the lower electrodes 126, may be formed as described above for FIG. 1E. The dielectric material 114 is formed between the base material 102 and the gate electrode 120, such that a substantially continuous portion of the dielectric material 114 substantially entirely surrounds the pillar regions 124 and the lower electrodes 126 of the gate electrode 120. Each of the upper electrode 122, the pillar regions 124, and the lower electrodes 126 are electrically and physically isolated from the base material 102 by the dielectric material 114.

The upper electrode 122 of the gate electrode 120 of the electronic device 100' of FIG. 2E may be formed to have the width $W_{122}$, and the lower electrode 126 of the gate electrode 120 may be formed to have the width $W_{126}$ that is relatively greater than or, alternatively, substantially equal to the width $W_{122}$ of the upper electrode 122. In some embodiments, the individual widths $W_{126}$ of the respective lower electrodes 126 may be substantially equal to one another such that lateral centers of each of the lower electrodes 126 are substantially laterally aligned with one another and each lateral end of the lower electrodes 126 is substantially laterally aligned with a lateral end of each of the lower electrodes 126 most proximate thereto. In other embodiments, the width $W_{126}$ of at least one of the lower electrodes 126 (e.g., a lowermost one) may differ from (e.g., be relatively greater than) the width $W_{126}$ of another one (e.g., an uppermost one) of the lower electrodes 126. The individual heights $H_{126}$ of the respective lower electrodes 126 may or may not be substantially equal to one another.

Formation of two or more of the lower electrodes 126 provides a greater surface area between the gate electrode 120 of the capacitors 130 and the base material 102 of the electronic device 100'. For example, the region 128 (e.g., the additional capacitance region) of two or more of the lower electrodes 126 may be expanded with the increased number of the lower electrodes 126 within the base material 102 in addition to the capacitance region of the upper electrode 122 above the upper surface 102a of the base material 102, as shown in FIG. 2E. Accordingly, the presence of the pillar regions 124 and two or more of the lower electrodes 126, in addition to the upper electrode 122, provides additional capacitance (e.g., storage node) regions compared to conventional electronic devices including conventional capacitors having one electrode external to another electrode of a base material and extending in a single direction.

Figure 2F:
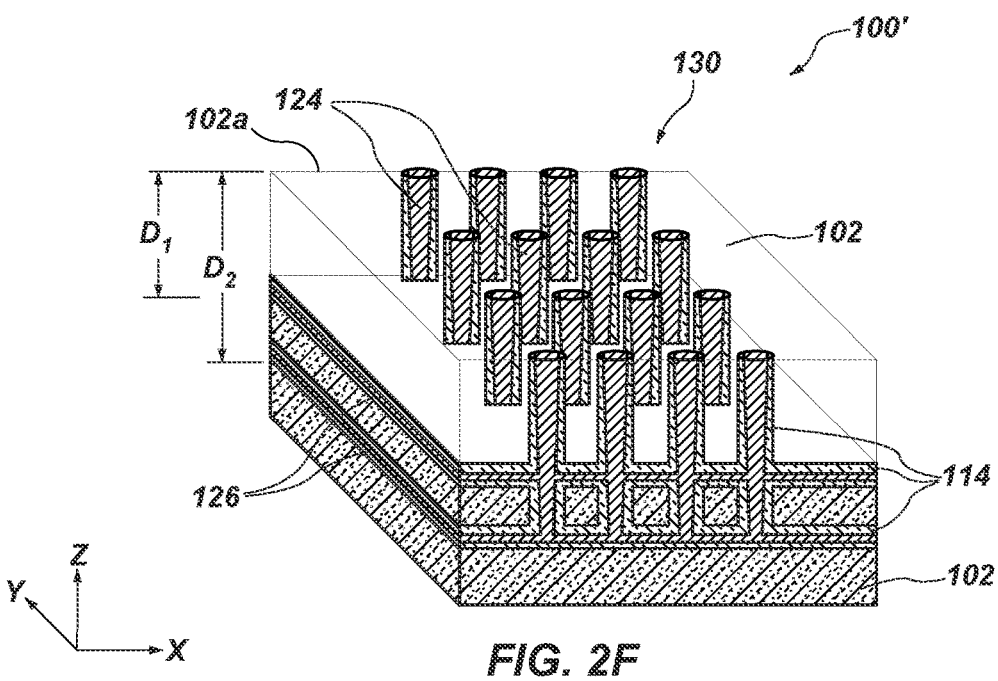
FIG. 2F is a perspective view of the electronic device of FIGS. 2A through 2E according to embodiments of the disclosure.

FIG. 2F is a perspective view of the electronic device 100' of FIGS. 2A through 2E. For simplicity, the upper electrode 122 is not shown in the perspective view of FIG. 2F. The gate electrode 120 of the capacitors 130 may be configured and arranged as described above for FIG. 1F. For example, the gate electrode 120 includes the upper electrode 122, the pillar regions 124, and the pillar regions 124, each of which are substantially continuous materials extending in the horizontal direction (e.g., the upper electrode 122, the lower electrode 126) and in the vertical direction (e.g., the pillar regions 124). As best shown in the perspective view of FIG. 2F, each of the upper electrode 122 and two or more of the lower electrodes 126 extend in a first horizontal direction (e.g., the X-direction) and in a second horizontal direction (e.g., the Y-direction). Since the doped regions 106 (FIG. 2A) are formed to be substantially parallel with one another, each of the lower electrodes 126 may be substantially parallel with one another and may individually be substantially parallel with the upper electrode 122 (FIG. 2E). The gate electrode 120 may be electrically and physically isolated from the base material 102 by the dielectric material 114.

As shown in FIG. 2F, the first depth $D_1$ may correspond to a distance between the upper surface 102a of the base material 102 and an upper surface of an uppermost (e.g., a first) one of the lower electrodes 126. A second depth $D_2$ may correspond to a distance between the upper surface 102a of the base material 102 and an upper surface of a lowermost (e.g., a second) one of the lower electrodes 126. In some embodiments, the vertical dimension (e.g., height) of the pillar regions 124 corresponds to the second depth $D_2$ in the embodiment of FIG. 2F. By way of non-limiting example, the first depth $D_1$ may be within a range of from about 200 nm to about 800 nm, such as within a range of from about 200 nm to about 400 nm, from about 400 nm to about 600 nm, or from about 600 nm to about 800 nm, and the second depth $D_2$ may be within a range of from about 400 nm to about 1000 nm (1 µm), such as within a range of from about 400 nm to about 600 nm, from about 600 nm to about 800 nm, or from about 800 nm to about 1000 nm. In some embodiments, the first depth $D_1$ may be about 300 nm and the second depth $D_2$ may be about 600 nm.

Figure 3A:
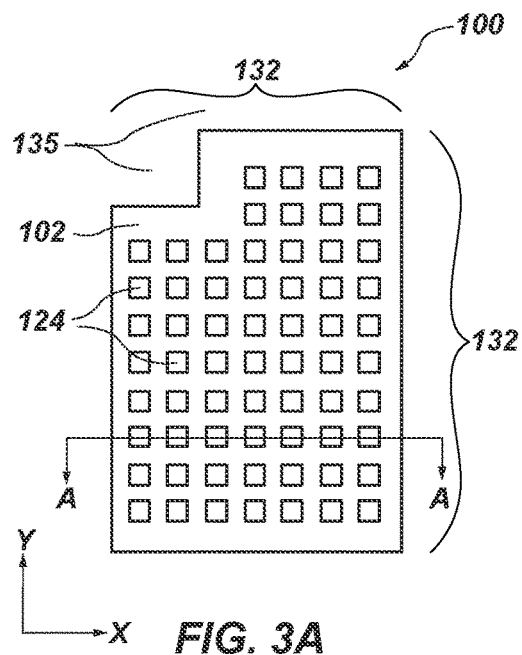
FIGS. 3A through 3E are top-down (FIGS. 3A, 3C, and 3E) and cross-sectional (FIGS. 3B and 3D) views illustrating the electronic device, according to embodiments of the disclosure, where the cross-sectional views of FIGS. 3B and 3D are taken along the A-A line and the B-B line, respectively, in FIGS. 3A and 3C.

FIGS. 3A through 3E and 4A through 4C show the electronic device 100 including the capacitors 130 after multiple process acts described above have been conducted. For convenience, the embodiments of FIGS. 3A through 3E and 4A through 4C are illustrated as embodiments of the electronic device 100 of FIGS. 1A through 1F except that additional gate electrodes 120 are shown. For example, FIG. 3A is a top-down view of the electronic device 100 of FIG. 1F. However, the embodiments of FIGS. 3A through 3E and 4A through 4C also apply to the embodiments of the electronic device 100' of FIGS. 2A through 2F. For simplicity, the upper electrode 122 is not shown in the top-down views of FIGS. 3A, 3C, and 3E.

Figure 3C:
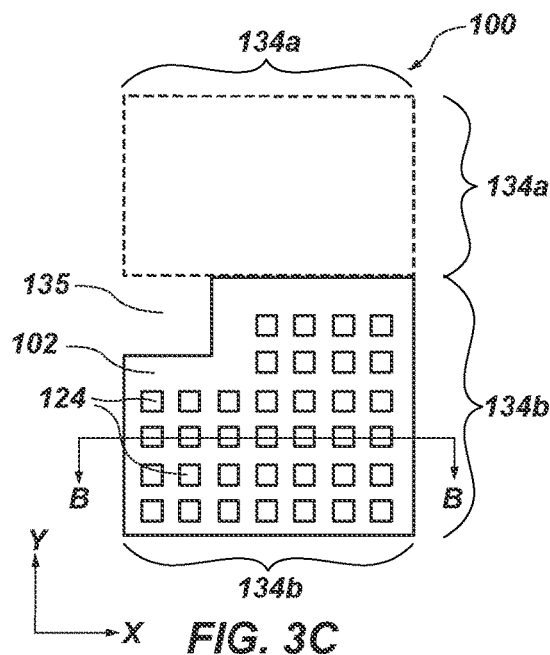
Figure 3B:
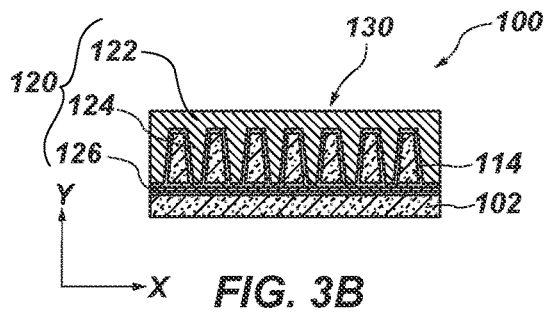

A cross-section of the electronic device 100 along line A-A of FIG. 3A is shown in FIG. 3B, with seven of the pillar regions 124 of the gate electrode 120 adjacent to one another in the horizontal direction. While FIG. 3B illustrates seven of the pillar regions 124, more or less than seven of the pillar regions 124 may be present. The gate electrode 120 may be electrically and physically isolated from the base material 102 by the dielectric material 114. As shown in FIGS. 3A and 3B, the electronic device 100 includes a first area 132 (e.g., a two-dimensional area) of the base material 102 including the upper electrode 122 of the gate electrode 120 adjacent to the base material 102, and each of the pillar regions 124 and the lower electrode 126 of the gate electrode 120 within the base material 102. The electronic device 100 may include a peripheral region 135 laterally adjacent to and at least partially (e.g., substantially entirely) surrounding a region (e.g., an active region) of the base material 102. In some embodiments, the peripheral region 135 may, optionally, include an additional region adjacent to and within one or more regions (e.g., corner regions) of the first area 132 of the base material 102, as shown in FIG. 3A. In other words, the first area 132 of the base material 102 may exhibit a substantially orthogonal (e.g., substantially rectangular) profile with the exception of one or more of the corners thereof, which include an additional region of the peripheral region 135, although other configurations may be contemplated. The peripheral region 135 may allow structural support of the electronic device 100 during formation of the openings (e.g., the openings 110, the openings 112 (FIG. 1C)). Accordingly, the gate electrode 120 (e.g., the upper electrode 122, the pillar regions 124, the lower electrode 126) may be present in the first area 132 of the base material 102 without being present in the peripheral region 135.

The first area 132 of the base material 102 of the electronic device 100 of FIG. 3A may represent an area that is similar (e.g., substantially the same) as an area of conventional electronic devices. However, the presence of the pillar regions 124 and the lower electrode 126 of the gate electrode 120, in addition to the upper electrode 122 thereof, provides additional capacitance (e.g., storage node) regions compared to conventional electronic devices having one electrode (e.g., a single upper electrode) external to (e.g. overlying) an upper surface of another electrode of a base material and extending in a single direction (e.g., a horizontal direction). In other words, conventional electronic devices may not include additional electrodes extending horizontally and vertically within the base material. In some embodiments, the capacitance regions of the electronic device 100 may be about twice (e.g., double) that of conventional electronic devices due to the configuration of the capacitors 130 (e.g., buried capacitors, two-sided capacitors) within the base material 102, which facilitates additional capacitance regions and associated additional storage capacity within a given footprint.

Figure 3D:
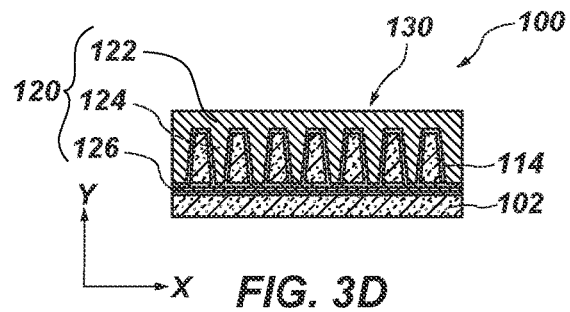

A cross-section of the electronic device 100 along line B-B of FIG. 3C is shown in FIG. 3D, with seven of the pillar regions 124 of the gate electrode 120 adjacent to one another in the horizontal direction, although more or less than seven of the pillar regions 124 may be present. The gate electrode 120 may be electrically and physically isolated from the base material 102 by the dielectric material 114. As shown in FIG. 3C, the electronic device 100 includes a second area 134a (e.g., a two-dimensional area) and a third area 134b (e.g., another two-dimensional area) of the base material 102. The second area 134a and the third area 134b combined exhibit the same area as the first area 132 in FIG. 3A. One or more of the second area 134a and the third area 134b of the base material 102 may be at least partially surrounded by the peripheral region 135. The peripheral region 135 may, optionally, include the additional region adjacent to and within one or more regions (e.g., corner regions) of the third area 134b of the base material 102, as shown in FIG. 3C. The embodiment of FIG. 3C differs from the embodiment of FIG. 3A in that a footprint of the capacitors 130 in the third area 134b may be relatively less than a footprint of the capacitors 130 in the first area 132 (FIG. 3A) and relatively less than a footprint of conventional electronic devices. In other words, the gate electrode 120 of the capacitors 130 of FIGS. 3C and 3D may allow capacitance regions and associated storage capacity that are similar (e.g., substantially the same) as that of conventional electronic devices within a reduced footprint. In some embodiments, the area (e.g., the third area 134b) of the electronic device 100 may be about one-half of the area of conventional electronic devices, although other configurations may be contemplated. In other words, the configuration of the capacitors 130 within the base material 102 facilitates comparable (e.g., similar) capacitance regions and associated storage capacity within a reduced footprint such that the second area 134a may be available for additional circuitry, such as additional capacitors 130 or other circuitry of the electronic device 100.

Figure 3E:
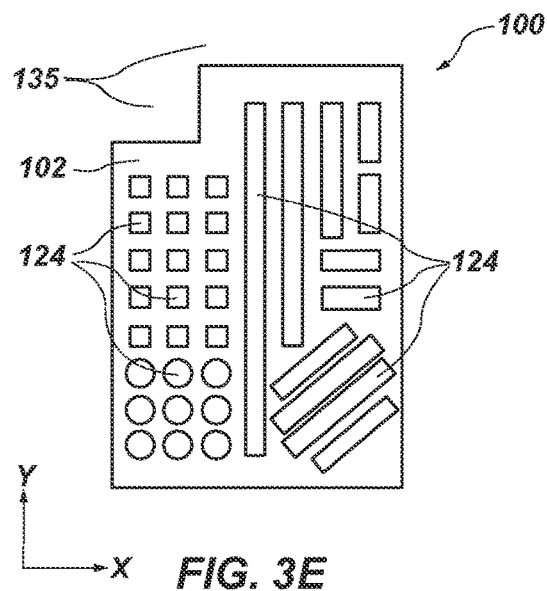

FIG. 3E illustrates possible configurations (e.g., sizes, shapes) of the pillar regions 124. For example, the pillar regions 124 of the gate electrode 120 (FIG. 3B) may be formed within the base material 102 in one or more rows and columns. As discussed above, the base material 102 may be patterned to accommodate placement of the pillar regions 124. For example, the openings 110 (FIG. 1B) may be defined within portions of the base material 102 that are configured (e.g., sized and shaped) to receive the pillar regions 124, as shown in FIG. 1E. Further, the pillar regions 124 may be separated by intermediary regions of the base material 102 located between adjacent portions thereof. An area of the base material 102 may be at least partially surrounded by the peripheral region 135, and the peripheral region 135 may, optionally, include the additional region adjacent to and within one or more regions (e.g., corner regions) of the area of the base material 102, as shown in FIG. 3E.

In some embodiments, the pillar regions 124 may each be formed to comprise a substantially circular cross-sectional (e.g., annular) shape, as shown in the lower, left-hand portion of the top-down view of FIG. 3E. In other embodiments, the pillar regions 124 may be formed to comprise a substantially square cross-sectional shape, as shown in the upper, right-hand portion of FIG. 3E. In such embodiments, individual portions of the pillar regions 124 may be discrete and separated by the intermediary regions of the base material 102 or, alternatively, individual portions of the pillar regions 124 may be substantially continuous (e.g., without separation) in a lattice-shaped structure, for example. In yet other embodiments, the pillar regions 124 may be formed to comprise a substantially rectangular cross-sectional shape in the form of an elongated bar (e.g., a slit), as shown in the upper, right-hand portion of FIG. 3E. The elongated bars may be substantially elliptical (e.g., having rounded ends) or substantially rectangular (e.g., having squared corners) and may extend in either the first horizontal direction (e.g., the X-direction) or the second horizontal direction (e.g., the Y-direction). Further, a longitudinal axis of such elongated bars may be oriented at an acute angle (e.g., a 45-degree angle) with respect to a longitudinal axis of one or more rows of the pillar regions 124, as shown in the lower, right-hand portion of FIG. 3E. While the electronic device 100 is illustrated in FIG. 3E as comprising an assortment of shapes and sizes of the pillar regions 124, it may be understood that the assortment is shown for illustrative purposes only and that any configuration of the electronic device 100 including patterns of the pillar regions 124 may include substantially uniform sizes and shapes.

Figure 4A:
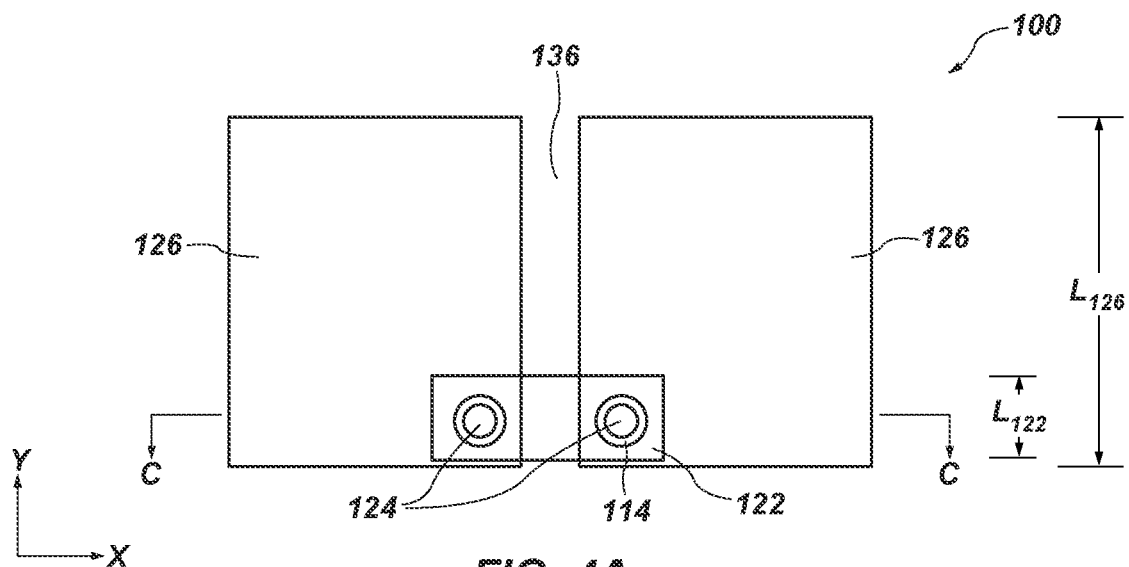
FIGS. 4A through 4C are top-down (FIG. 4A) and cross-sectional (FIGS. 4B and 4C) views illustrating the electronic device, according to embodiments of the disclosure, where the cross-sectional views of FIGS. 4B and 4C are taken along the C-C line in FIG. 4A.
Figure 4B:
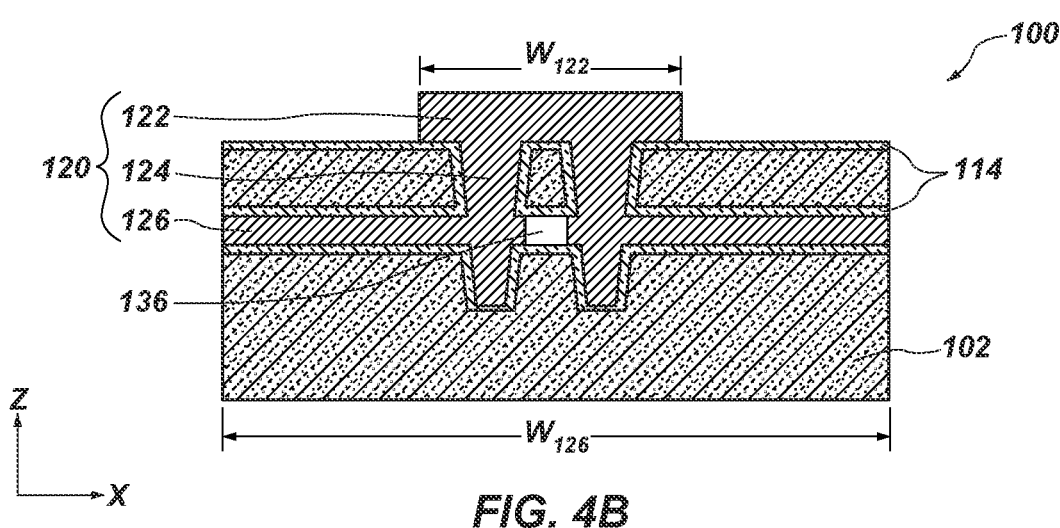
Figure 4C:
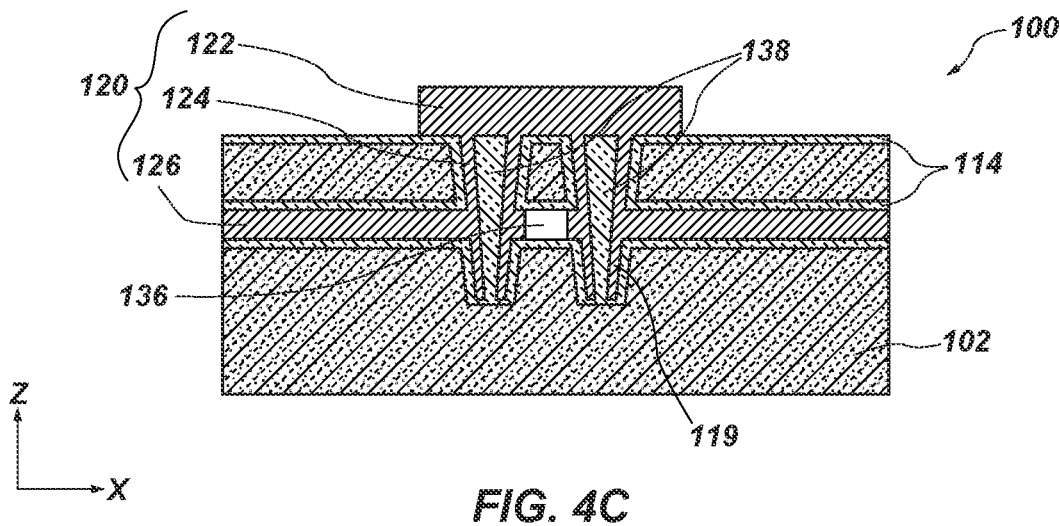

While the embodiments above are described and illustrated as including the lower electrode 126 of the gate electrode 120 extending continuously in the horizontal direction, the lower electrode 126 may include discrete portions, in some embodiments. Cross-sections of the electronic device 100 along line C-C of FIG. 4A are shown in FIGS. 4B and 4C, with two pillar regions 124 of the gate electrode 120 adjacent to one another in the horizontal direction. As shown in FIGS. 4A and 4B, the electronic device 100 includes the upper electrode 122, the pillar regions 124, and the lower electrode 126 of the gate electrode 120. For simplicity, the dielectric material 114 and upper portions of the base material 102 are not shown in the top-down view of FIG. 4A. The embodiment of FIGS. 4A and 4B differs from the embodiment of FIG. 3B in that at least some of the lower electrodes 126 of the gate electrode 120 may include individual portions that are separate from one another within the base material 102. In other words, at least some of the lower electrodes 126 may be discrete (e.g., discontinuous) portions thereof. As used herein, the term "discrete" means and includes a region or material that is defined by one or more differing regions or materials. As shown in FIGS. 4A and 4B, the individual portions of the lower electrode 126 may be separated by an intermediary region 136 (e.g., a gap). The individual portions of the lower electrode 126 may include one or more of the pillar regions 124 surrounded by the dielectric material 114. While not illustrated in FIG. 4B, at least some of the upper electrodes 122 of the gate electrode 120 may also include individual portions that are separate from one another. In other words, at least some of the upper electrodes 122 may be discrete (e.g., discontinuous) portions thereof. In some embodiments, the pillar regions 124 of the gate electrode 120 are vertically adjacent to (e.g., over) the top portion of the lower electrode 126. In other embodiments, at least some of the pillar regions 124 may extend vertically through the lower electrode 126 and into a lower portion of the base material 102, as shown in FIG. 4B.

As illustrated in FIG. 4B, the upper electrode 122 of the gate electrode 120 may have the width $W_{122}$ in the first horizontal direction (e.g., the X-direction) and the lower electrode 126 of the gate electrode 120 may have the width $W_{126}$ in the first horizontal direction that is relatively greater than the width $W_{122}$ of the upper electrode 122, as described in greater detail with reference to FIG. 1E. As illustrated in FIG. 4A, a length $L_{126}$ of the lower electrode 126 may also be relatively greater than a length $L_{122}$ of the upper electrode 122 in the second horizontal direction (e.g., the Y-direction). Therefore, an area (e.g., a two-dimensional area) of the lower electrode 126 may be relatively greater than an area (e.g., a two-dimensional area) of the upper electrode 122, as shown in FIG. 4A. Accordingly, the respective areas of the upper electrode 122 and the lower electrode 126 may be tailored in order to optimize the respective areas, provided that at least a portion of each of the upper electrode 122 and the lower electrode 126 is in contact (e.g., electrical contact, direct physical contact) with the pillar regions 124, as shown in FIGS. 4A and 4B. For example, the area of the upper electrode 122 may be minimized (e.g., reduced) and the area of the lower electrode 126 may be maximized (e.g., increased) to provide increased capacitance of the gate electrode 120 within a given footprint.

In some embodiments, at least some of the lower electrodes 126 may extend beyond an area designated for the capacitors 130. For example, portions of the lower electrodes 126 may extend beyond a lateral area including the capacitors 130 and into adjacent areas including additional circuitry of the electronic device 100, for example, provided that there is access to form the sacrificial material 105 of the doped region 106, as illustrated in FIG. 1A and to form the lower electrode 126, as illustrated in FIG. 1E. While the pillar regions 124 are illustrated in FIG. 4A as comprising a substantially circular cross-sectional shape proximate corners of the lower electrode 126, it may be understood that the pillar regions 124 may comprise additional sizes, shapes, and locations relative to the lower electrode 126 such that at least a portion of each of the upper electrode 122 and the lower electrode 126 is in contact with one or more of the pillar regions 124. In other words, the additional electrodes of the pillar regions 124 may include alternative sizes and shapes. For example, the pillar regions 124 may include the elongated bars (FIG. 3E) proximate to (e.g., extending along) lateral edges of the lower electrode 126.

As shown in FIG. 4C, the electronic device 100 may include a support structure 138 including one or more additional materials (e.g., insulative materials, support structures) within the pillar regions 124 of the gate electrode 120 such that the pillar regions 124 also function as mechanical support pillars. For example, at least some of the pillar regions 124 may function as mechanical support pillars positioned within selected regions of the base material 102 to provide uniform support when components are stacked, in addition to providing capacitance (e.g., storage node) regions of the gate electrode 120. For example, the pillar regions 124 including the support structure 138 may be positioned proximate one or more of a central region and a peripheral region of the base material 102. In other words, the pillar regions 124 including the support structure 138 may be positioned within or proximate to regions of the base material 102 that are prone to warpage.

At least some of the pillar regions 124 may include the support structure 138 overlying (e.g., in vertical alignment with) the lower electrode 126. As shown in FIG. 4C, the support structure 138 may be located within a central portion of the openings 110 (FIG. 1D) in some embodiments. For example, the support structure 138 may substantially completely fill a remainder of the openings 110 (e.g., substantially cylindrical openings) so as to substantially fully extend between sidewalls of the conductive material 119 of the pillar regions 124. In other embodiments, the support structure 138 may be adjacent to (e.g., laterally adjacent to) a side surface of the dielectric material 114 such that the conductive material 119 of the pillar regions 124 is in a central portion of the openings 110. The support structure 138 may or may not be in direct physical contact with the base material 102. In embodiments including the support structure 138 in the pillar regions 124, the conductive material 119 of the pillar regions 124 may comprise the same material or materials as that of the upper electrode 122 and the lower electrode 126 of the gate electrode 120 to provide a substantially continuous portion of the conductive material 119 within the gate electrode 120, as shown in FIG. 4C. In yet other embodiments, at least some pillar regions 124 may include the support structure 138 without including the conductive material 119 of the pillar regions 124 of the gate electrode 120. For example, mechanical support pillars including the support structure 138 may be positioned to at least partially surround (e.g., substantially surround) an area designated for the pillar regions 124 of the gate electrode 120. For convenience, the embodiment of FIG. 4C is illustrated as an embodiment of the electronic device 100 of FIGS. 4A and 4B. However, the embodiment of FIG. 4C may also apply to the embodiments of the electronic device 100 of FIGS. 1A through IF and the electronic device 100' of FIGS. 2A through 2F.

The electronic devices 100, 100' according to embodiments of the disclosure may include, but is not limited to, a 3D electronic device, such as a 3D NAND Flash memory device, (e.g., a multideck 3D NAND Flash memory device). However, the electronic devices 100, 100' according to embodiments of the disclosure may be used in other memory devices having capacitors, which may include one or more of spin torque transfer magnetic random access memory (STT-MRAM), magnetic random access memory (MRAM), dynamic random access memory (DRAM), static random access memory (SRAM), racetrack memory, and other known memory types.

Accordingly, an electronic device is disclosed. The electronic device comprises one or more capacitors adjacent to a base material. The one or more capacitors comprise at least one electrode extending horizontally within the base material, and additional electrodes extending vertically within the base material and contacting the at least one electrode. The at least one electrode is located below and isolated from an upper surface of the base material.

Accordingly, an electronic device is disclosed and comprises capacitors including gate electrodes. Each of the gate electrodes comprise an upper electrode adjacent to an upper surface of a base material, at least one lower electrode horizontally extending within the base material, and pillar regions vertically extending within the base material between the upper electrode and the at least one lower electrode.

Accordingly, a method of forming an electronic device is disclosed and comprises forming a sacrificial material extending horizontally within a base material. The sacrificial material is below and isolated from an upper surface of the base material. The method comprises forming openings extending to the sacrificial material, removing the sacrificial material within the openings, and forming a conductive material adjacent to the upper surface of the base material and within the openings. The conductive material is configured as a gate electrode of a capacitor.

The gate electrode 120, including the upper electrode 122, the pillar regions 124, and the lower electrode 126, of the electronic devices 100, 100' facilitates increased capacitance in the capacitors 130 within a given footprint (e.g., an area occupied by the capacitor structures 130), which may provide for either increased capacitance within a given area (e.g., a two-dimensional area) or a reduced area allocated for the capacitors 130. For example, the presence of the pillar regions 124 and the lower electrode 126 within the base material 102, in addition to the upper electrode 122 overlying the base material 102, provides additional capacitance (e.g., storage node) regions compared to conventional electronic devices having a single electrode external to and overlying an upper surface of a base material. Alternatively, the configuration of the gate electrode 120 of the capacitors 130 may allow capacitance regions and associated storage capacity that are similar (e.g., substantially the same) as that of conventional electronic devices within a reduced footprint. The two-sided (e.g., opposing) regions of each of the first opposing surfaces 116 and the second opposing surfaces 118 of the base material 102, in combination with the vertical orientation of the pillar regions 124 and the horizontal orientation of the lower electrode 126 of the gate electrode 120 below and isolated from the upper surface 102a of the base material 102, changes the configuration of the capacitors 130 of the electronic devices 100, 100'. For example, the pillar regions 124 and one or more of the lower electrodes 126 of the gate electrode 120 provide a greater surface area between the gate electrode 120 of the capacitors 130 and the base material 102 for increased capacitance within a given area and/or for reduced footprint to optimize packing density. Accordingly, the capacitors 130 may have increased capacitance efficiency per unit area in comparison to conventional capacitors (e.g., planar capacitors). Therefore, the capacitance of the capacitors 130 is increased without the need to increase the footprint requirements.

Figure 5A:
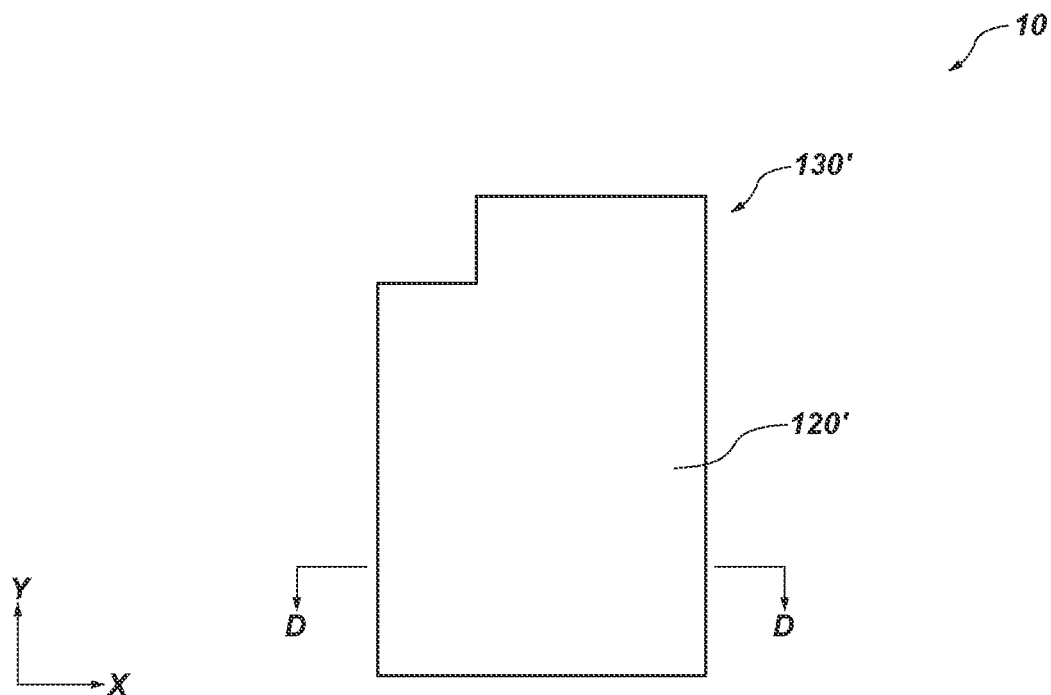
FIGS. 5A and 5B are top-down (FIG. 5A) and cross-sectional (FIG. 5B) views of conventional electronic devices at a similar processing stage as that of FIGS. 3A and 3B, where the cross-sectional view of FIG. 5B is taken along the D-D line in FIG. 5A.
Figure 5B:
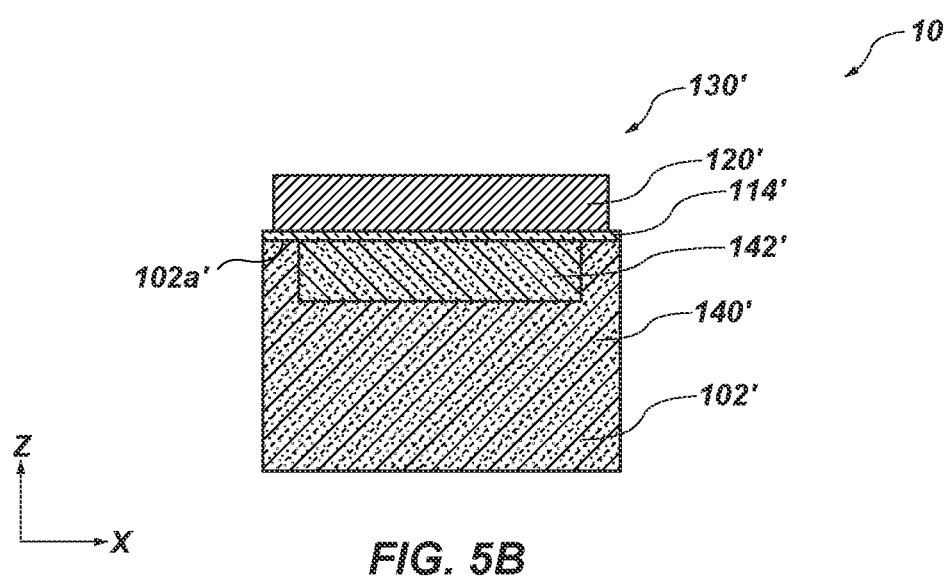

In contrast to the embodiments of the disclosure, a gate electrode 120' of conventional capacitors 130' may not extend in the vertical direction (e.g., the Z-direction) and may not extend horizontally within the base material 102' in a conventional electronic device. FIG. 5B is a cross-sectional view along line D-D of FIG. 5A of a conventional electronic device 10 at a similar stage of fabrication as FIGS. 3A and 3B. As shown in FIGS. 5A and 5B, the capacitors 130' (e.g., a planar capacitor structure) may include a single region of a gate electrode 120' (e.g., a single upper electrode) external to and overlying the base material 102' and extending in the horizontal direction. For example, the base material 102' may include a p-doped region 140' and an n-well region 142' within the base material 102', as shown in FIG. 5B. The dielectric material 114' may be located adjacent to (e.g., over) portions of each of the p-doped region 140' and the n-well region 142' (e.g., over an upper surface 102a' of the base material 102') and the gate electrode 120' may be located over the dielectric material 114'. The base material 102' may include source/drain regions (not shown).

Accordingly, the gate electrode 120' of the conventional electronic device 10 includes a single region (e.g., one electrode) external to and overlying the base material 102'. In such devices, the capacitors 130' including the single region of the gate electrode 120' extending only in the horizontal direction may exhibit decreased capacitance (e.g., storage node) regions, which may result in requirements for increased area (e.g., increased footprint requirements) for the capacitors 130' within the conventional electronic device 10. Further, the single region of the gate electrode 120' provides an opposing surface with the base material 102' in only one (e.g., a single) dimension, compared to providing more than one (e.g., two or more) opposing surfaces in more than one dimension (e.g., in two dimensions) in the electronic devices 100, 100'. For example, the capacitors 130 of the electronic devices 100, 100' according to embodiments of the disclosure include the orthogonal arrangement of the two-sided regions of each of the first opposing surfaces 116 and the second opposing surfaces 118 of the base material 102, as shown in FIGS. 1D and 2D. Further, the capacitors 130 include the vertical orientation of the pillar regions 124 and the horizontal orientation of the lower electrode 126 of the gate electrode 120 below and isolated from the upper surface 102a of the base material 102, as shown in FIGS. 1E and 2E. Such an arrangement provides a greater surface area between the gate electrode 120 of the capacitors 130 and the base material 102 of the electronic devices 100, 100'.

The electronic devices and methods according to embodiments of the disclosure increases capacitance within a given area or reduces an area allocated for the capacitors 130 due to the presence of the pillar regions 124 and the lower electrode 126 within the base material 102, in addition to the upper electrode 122 overlying the base material 102. Formation of the sacrificial material 105 of the doped region 106 within the undoped region 108 of the base material 102 according to embodiments of the disclosure may reduce various processing complexities (e.g., complexities associated with patterning the base material 102) associated with the formation of additional regions (e.g., the pillar regions 124, the lower electrode 126) of the gate electrode 120 within the base material 102. The increased capacitance (e.g., storage node) regions within the base material 102 according to embodiments of the disclosure may facilitate an increased capacitance per area without increasing the amount of real estate occupied by the capacitors 130.

Accordingly, the methods as disclosed in FIGS. 1A through 1F and FIGS. 2A through 2F may facilitate formation of the pillar regions 124 of the gate electrode 120 in the vertical direction and formation of one or more of the lower electrodes 126 thereof in the horizontal direction within the base material 102. Such methods also facilitate removal of the sacrificial material 105 of the doped region 106 (FIG. 1A) to facilitate formation of the gate electrode 120 for improved capacitance properties within the electronic devices 100, 100'.

Figure 6:
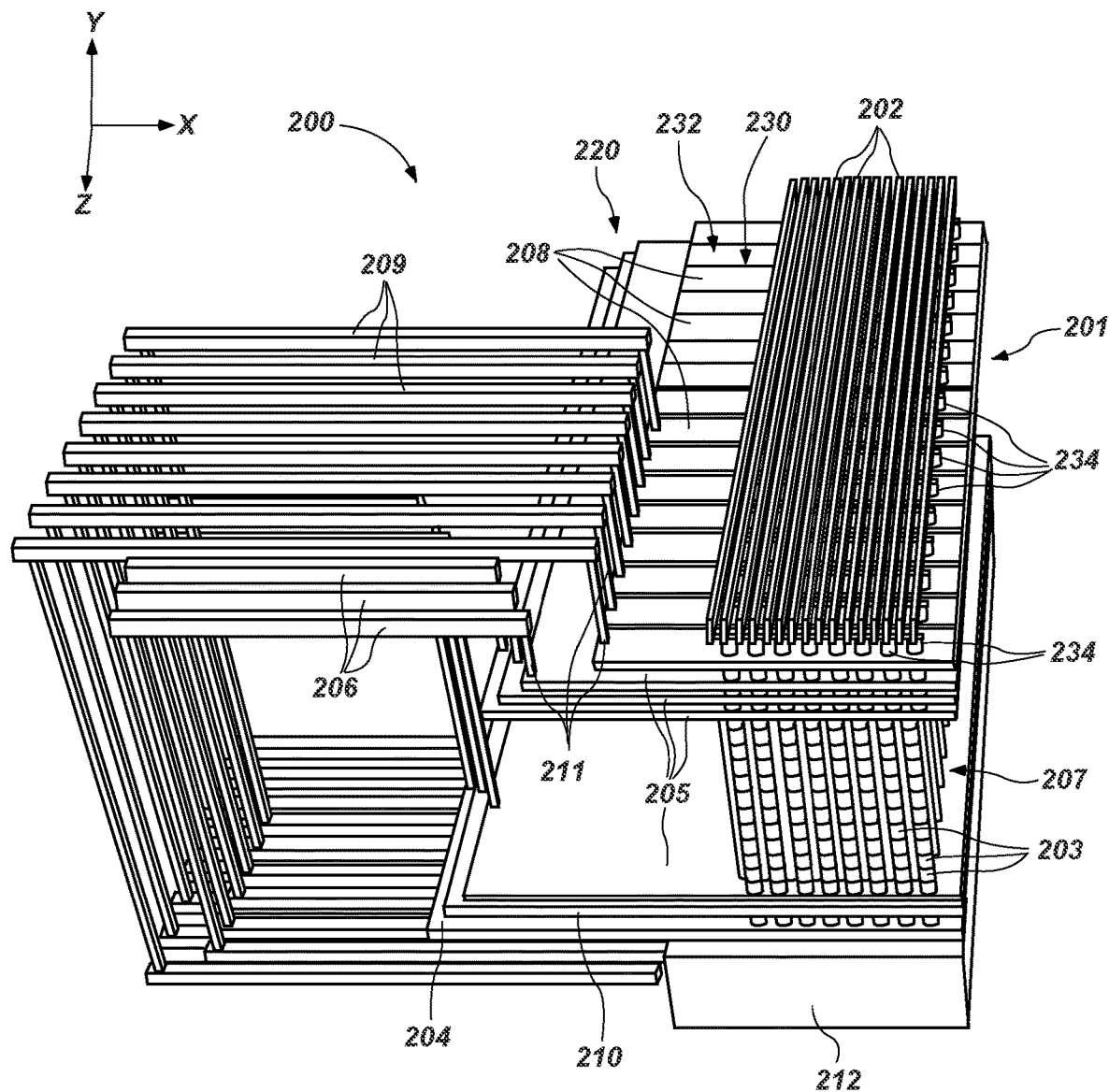
FIG. 6 is a partial cutaway perspective view of an electronic device according to embodiments of the disclosure.

FIG. 6 illustrates a partial cutaway perspective view of a portion of an electronic device 200 (e.g., a microelectronic device, a memory device, such as a 3D NAND Flash memory device) including an electronic structure 201 (e.g., a microelectronic device structure). The electronic device 200 may be substantially similar to the electronic devices 100, 100' previously described with reference to FIGS. 1A through 4C. As shown in FIG. 6, the electronic structure 201 of the electronic device 200 may include a staircase structure 220 defining contact regions for connecting access lines 206 to conductive structures 205. The electronic structure 201 may include vertical strings 207 of memory cells 203 that are coupled to each other in series. The vertical strings 207 may extend vertically (e.g., in the Z-direction) and orthogonally to conductive lines and the conductive structures 205, such as data lines 202, a source tier 204, the access lines 206, first select gates 208 (e.g., upper select gates, drain select gates (SGDs)), select lines 209, and a second select gate 210 (e.g., a lower select gate, a source select gate (SGS)). The first select gates 208 may be horizontally divided (e.g., in the Y-direction) into multiple blocks 232 horizontally separated (e.g., in the Y-direction) from one another by slots 230.

Vertical conductive contacts 211 may electrically couple components to each other as shown. For example, the select lines 209 may be electrically coupled to the first select gates 208 and the access lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, circuitry for temporarily storing data (e.g., including the capacitors 130 of the electronic devices 100, 100' (FIGS. 1E and 2E)), and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual group of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the access lines 206 and the conductive structures 205 through the vertical conductive contacts 211. In other words, an individual conductive structure 205 may be selected via an access line 206 in electrical communication with a respective vertical conductive contact 211 in electrical communication with the conductive structure 205. The data lines 202 may be electrically coupled to the vertical strings 207 through conductive contact structures 234.

Figure 7A:
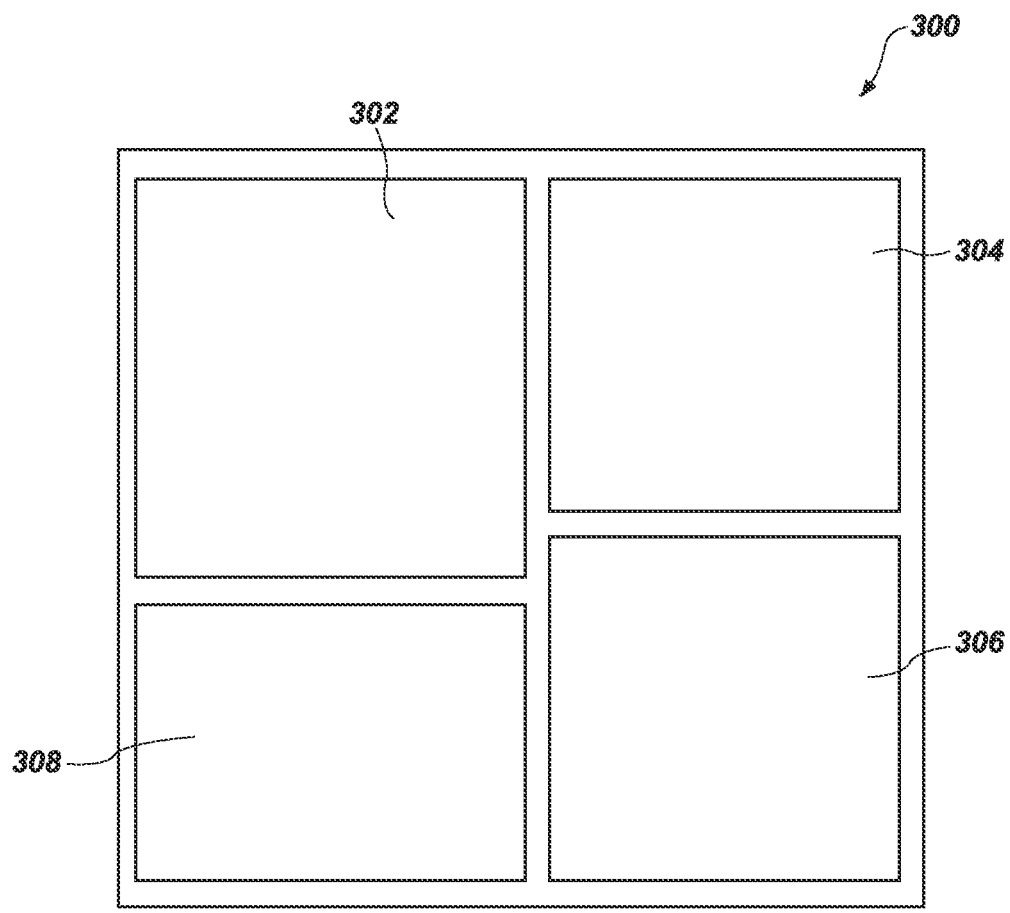
FIG. 7A is a schematic block diagram illustrating an electronic device according to embodiments of the disclosure.

Apparatuses including one or more of the electronic devices 100, 100', 200 such as those shown in FIGS. 1A through 4C and FIG. 6 may be used in embodiments of electronic devices of the disclosure. FIG. 7A is a block diagram of an illustrative electronic device 300 (e.g., a 3D NAND Flash memory device) according to an embodiment of the disclosure. The electronic device 300 may include at least one memory cell array 302 such as, for example, a plurality of memory arrays. The electronic device 300 may further include at least one peripheral circuit 304 that inputs data from outside the electronic device 300, thus providing access to the at least one memory cell array 302. The electronic device 300 may further include a charge pump circuit 306 for generating an input voltage. The peripheral circuit 304 and the charge pump circuit 306 may include one or more capacitors, such as the embodiments of the capacitors 130 of the electronic devices 100, 100' shown in FIGS. 1A through 4C. The peripheral circuit 304 and charge pump circuit 306 may communicate electrically with the at least one memory cell array 302 by way of the capacitors 130. For example, the electronic device 300 may include the memory cell arrays 302, which may include a complementary metal-oxide-semiconductor (CMOS) region, such as CMOS under array (CuA) region 308 (e.g., the control unit 212 (FIG. 6)) underlying the memory cell arrays 302. The memory cell arrays 302 may include memory cells (e.g., the memory cells 203 (FIG. 6)) that are connected to access lines (e.g., the access lines 206 (FIG. 6)) and digit lines (e.g., bit lines, the data lines 202 (FIG. 6)). Further, the CuA region 308 may underlie the memory cell arrays 302 and include support circuitry thereof, as described in greater detail with reference to FIG. 7B. The support circuitry may support one or more additional arrays of memory cells present in a stacked configuration. For example, the electronic device 300, including the memory cell array 302 having memory cells, can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. In a stacked configuration, the CuA region 308 may facilitate accessing one or more memory cells in each array. For example, the CuA region 308 may facilitate the transfer of data between a memory cell coupled to a channel of a memory cell array 302, a memory cell coupled to a channel of an additional memory cell array 302 that is coupled to memory cell array 302, and a controller.

Figure 7B:
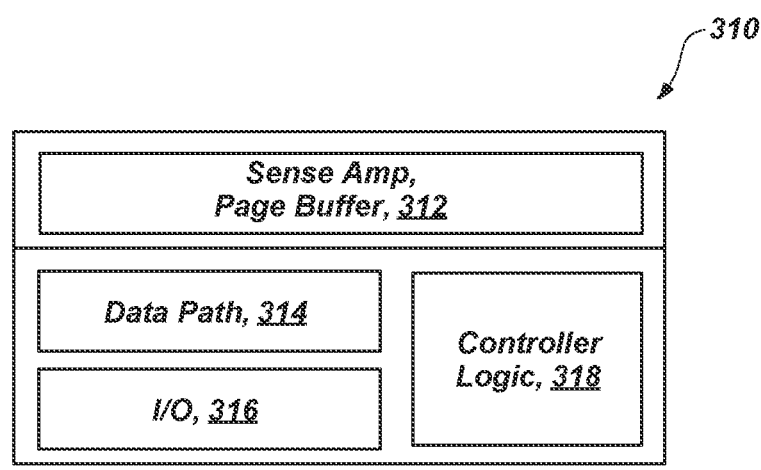
FIG. 7B is a portion of a schematic diagram of the electronic device of FIG. 7A.

FIG. 7B is a portion of a schematic diagram of the electronic device 300 of FIG. 7A. In some embodiments, the electronic device 300 may include a control logic region 310 of the CuA region 308 vertically neighboring the memory cell array 302 of the electronic device 300. The control logic region 310 may be included, for example, within the control unit 212 of the electronic device 200, described above with reference to FIG. 6. The control logic region 310 may include additional logic devices and circuitry for controlling various operations of the memory cell array 302. The devices and circuitry of the control logic region 310 may be selected relative to the devices and circuitry of the memory cell array 302. The devices and circuitry of the control logic region 310 may be different than the devices and circuitry of the memory cell array 302.

By way of non-limiting example, the control logic region 310 may include one or more sense amplifiers and page buffers 312, data path 314, I/O devices 316, and controller logic 318. In some embodiments, the control logic region 310 includes one or more row decoders. In some embodiments, the horizontal area occupied by the devices of the control logic region 310 (e.g., the sense amplifiers and page buffers 312, the data path 314, the I/O devices 316, and the controller logic 318) may be substantially the same as a horizontal area occupied by the memory cell array 302. In other words, the devices of the control logic region 310 may be located within an area that corresponds to the area occupied by the memory cell array 302. Accordingly, the control logic region 310 die may be stacked to vertically neighbor the memory cell array 302 and may not occupy additional area relative to the memory cell array 302.

The sense amplifiers of the sense amplifiers and page buffers 312 may be configured to receive digit line inputs from digit lines (e.g., the data lines 202 (FIG. 6)) selected by a column decoder and to generate digital data values during read operations. Accordingly, the sense amplifiers may be configured and operated to sense (read) data from memory cells (e.g., the memory cells 203 (FIG. 6)) of the memory array (e.g., the memory cell array 302 (FIG. 7A)). In some embodiments, the column decoder is located within the control logic region 310.

The page buffers of the sense amplifiers and page buffers 312 may be configured to receive data from the memory cells 203 (FIG. 6) of strings of memory cells (e.g., the vertical strings 207 (FIG. 6)) of the memory cell array 302 (FIG. 7A) and store the data (e.g., temporarily store the data) during various read and write operations. The page buffers 312 may be in operably communication with the data path 314 and the I/O devices 316 and may facilitate increased transfer of data between the I/O devices 316 and the strings of memory cells of the memory array. In some embodiments, the page buffers 312 each individually comprise the same size (capacity) as that of a memory page in which data read from the memory cells of the memory page are temporarily stored before being serially output (e.g., to one or more I/O devices 316). In addition, the page buffers 312 may be configured to store information that is to be written to a memory page of the memory cells 203. Accordingly, the page buffers 312 may include a relatively large number of volatile storage elements, typically bistable elements or latches, in a number corresponding to the number of memory cells of the memory page.

The data path 314 may be configured and operated to provide data to one or more devices (e.g., logic devices) of the electronic device 300 (FIG. 7A). For example, the data path 314 may be configured and operated to move data values to and/or from the memory cells 203 (FIG. 6) of cell pillar structures to and/or from one or more devices (e.g., logic devices). The data path 314 may be associated with the memory array and with, for example, the I/O devices 316 (e.g., data input/output pads), page buffers 312, the controller logic 318, and other devices. For example, the data path 314 may be located between memory banks and corresponding data input/output terminals (DQ pads).

The I/O devices 316 may be configured and operated to program data into memory elements (e.g., the memory cells 203 (FIG. 6)) of the memory cell array 302 (FIG. 7A) by placing proper voltages on the digit lines selected by the column decoder. In some embodiments, the I/O devices 316 may be used for bi-directional data communication with a host over a data bus and may be coupled to write circuitry configured for writing data to the memory array.

The controller logic 318 may be configured to control one or more operations of the memory cell array 302, including, for example, data sensing operations (e.g., read operations) and data programming operations (e.g., write operations). In some embodiments, the controller logic 318 is configured to sense changes in external signals and configured to issue internal signals based on, for example, whether the external signals are a read operation, a write operation, or another signal. For example, the controller logic 318 may receive inputs comprising a chip select signal, a read/write signal (e.g., write enable signals, address latch signals), or another signal. Responsive to receiving a read/write signal, the controller logic 318 may send a signal (e.g., a read enable signal, a write enable signal) to, for example, a row decoder and/or a column decoder. The row decoder, as described above, may be configured to send an address signal to a word line driver located within the memory cell array 302. The row decoder may be configured and operated to select particular word lines (e.g., the access lines 206 (FIG. 6)) of the memory array based on the row address signal received thereby. The row decoder may output a word line section command to the word line driver. The column decoder may be configured and operated to select particular digit lines of the memory array based on the column address selection signal received thereby.

The sense amplifiers and page buffers 312 may include capacitors (e.g., the capacitors 130 (FIGS. 1E and 2E)). In some such embodiments, the sense amplifiers and page buffers 312 circuits may utilize the capacitors 130 including the configuration of the gate electrode 120 (e.g., the upper electrode 122, the pillar regions 124, and the lower electrode 126) to facilitate either an increased capacitance within a given area (FIG. 3A) or a reduced area allocated for the capacitors 130 (FIG. 3C) within the control logic region 310. Such a configuration may facilitate a higher density of memory array (e.g., the memory cell array 302 (FIG. 7A)) structures within a given area due to the higher density and/or the reduced area of the capacitors 130 within the sense amplifiers and page buffers 312. In some embodiments, one or more of the capacitors 130 may be electrically connected between a power supply electrode (e.g., $V_{CC}$) and a ground electrode (e.g., $V_{GND}$). In some such embodiments, the capacitors 130 may be configured to substantially reduce or substantially eliminate (e.g., filter out) electrical signals (e.g., noise) from a power supply (not shown) in so-called "quieting" circuits utilizing the capacitors 130. Use of the multiple regions of the gate electrode 120 overlying and within the base material 102, as discussed in further detail above, provides an optimized use of area such that an area allocated to the capacitors 130 located between the power supply electrode and the ground electrode is reduced and reliability of the electronic device 300 is improved.

Figure 8:
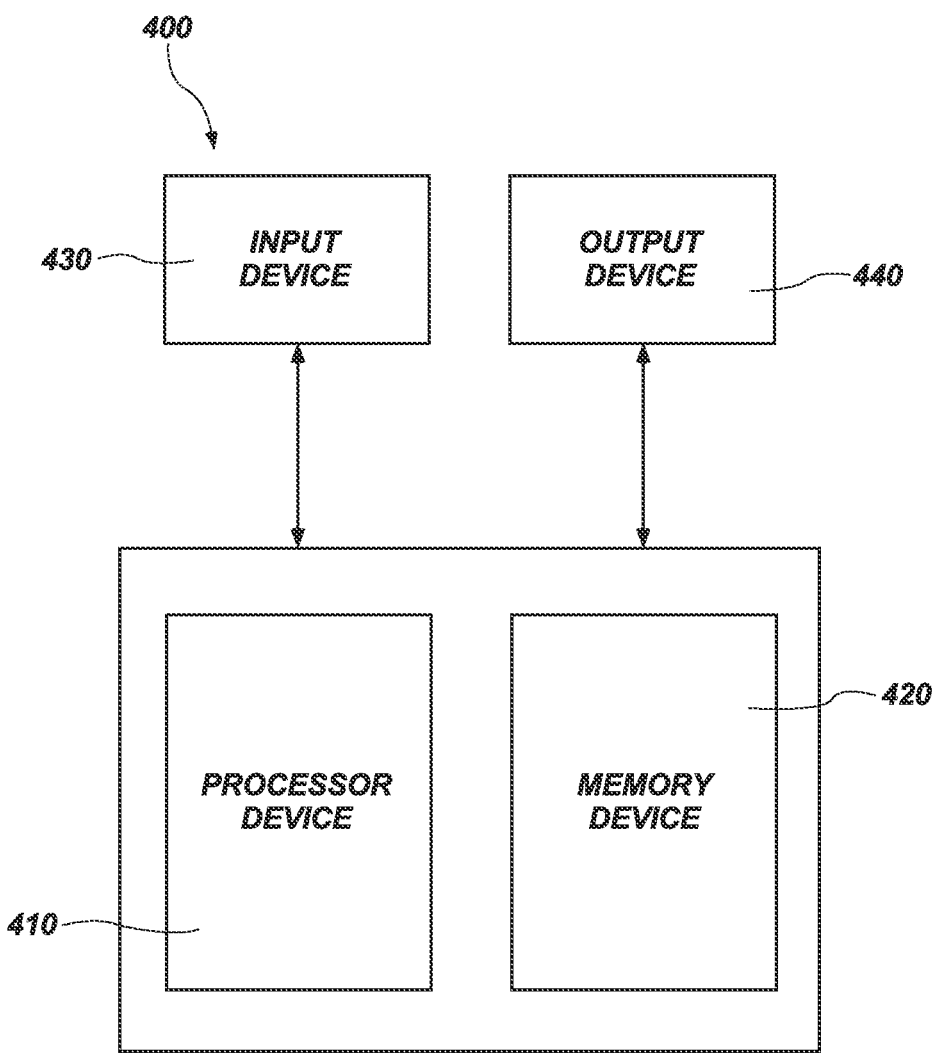
FIG. 8 is a schematic block diagram illustrating a system according to embodiments of the disclosure.

An electronic system 400 is also disclosed, as shown in FIG. 8, and includes the electronic devices 100, 100', 200, 300 according to embodiments of the disclosure. FIG. 8 is a simplified block diagram of the electronic system 400 implemented according to one or more embodiments described herein. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 420, which includes the electronic devices 100, 100', 200, 300 as previously described. The electronic system 400 may further include at least one processor device 410, such as a microprocessor, to control the processing of system functions and requests in the electronic system 400. The processor device 410 and other subcomponents of the electronic system 400 may include the memory cells. The processor device 410 may, optionally, include one or more memory cell arrays 302 (FIG. 7A) as previously described.

Various other devices may be coupled to the processor device 410 depending on the functions that the electronic system 400 performs. For example, an input device 430 may be coupled to the processor device 410 for inputting information into the electronic system 400 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 440 for outputting information (e.g., visual or audio output) to a user may also be coupled to the processor device 410. The output device 440 may include an LCD display, an SED display, a CRT display, a DLP display, a plasma display, an OLED display, an LED display, a three-dimensional projection, an audio display, or a combination thereof. The output device 440 may also include a printer, an audio output jack, a speaker, etc. In some embodiments, the input device 430 and the output device 440 may comprise a single touchscreen device that can be used both to input information to the electronic system 400 and to output visual information to a user. The one or more input devices 430 and output devices 440 may communicate electrically with at least one of the memory device 420 and the processor device 410. The at least one memory device 420 and processor device 410 may also be used in a system on chip (SoC).

Accordingly, a system is disclosed. The system comprises a processor operably coupled to an input device and an output device, and an electronic device operably coupled to the processor. The electronic device comprises at least one array of memory cells, and buried capacitors adjacent to a base material. Each of the buried capacitors comprises a gate electrode having a first region extending in a vertical direction and at least one second region extending in a horizontal direction substantially transverse to the vertical direction. The first region is substantially continuous with the at least one second region.

The electronic devices and systems of the disclosure advantageously facilitate one or more of improved simplicity, greater packaging density, and increased miniaturization of components as compared to conventional structures, conventional devices, and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
one or more capacitors adjacent to a base material, the one or more capacitors comprising:
at least one electrode extending horizontally within the base material, the at least one electrode located below and isolated from an upper surface of the base material;
additional electrodes extending vertically within the base material and directly physically contacting the at least one electrode; and
an upper electrode overlying the upper surface of the base material, the upper electrode directly physically contacting the additional electrodes with a major surface of the upper electrode substantially transverse to a longitudinal axis of the additional electrodes, portions of the base material vertically intervening between the at least one electrode and the upper electrode.

2. The electronic device of claim 1, wherein the major surface of the upper electrode is substantially parallel with a major surface of the at least one electrode.

3. The electronic device of claim 1, wherein the one or more capacitors are configured as buried, two-sided capacitors.

4. The electronic device of claim 1, wherein the one or more capacitors comprise first opposing surfaces of the base material horizontally adjacent to the additional electrodes and second opposing surfaces of the base material vertically adjacent to the at least one electrode, the second opposing surfaces of the base material being substantially orthogonal to the first opposing surfaces of the base material.

5. The electronic device of claim 1, further comprising a dielectric material adjacent to the at least one electrode, the additional electrodes, and the upper electrode, portions of the dielectric material extending directly between the upper electrode and the base material.

6. The electronic device of claim 5, wherein the at least one electrode is distal from the portions of the dielectric material extending directly between the upper electrode and the base material.

7. The electronic device of claim 5, wherein multiple portions of the dielectric material vertically intervene between the upper electrode and the at least one electrode.

8. The electronic device of claim 1, wherein the at least one electrode comprises a single electrode.

9. The electronic device of claim 1, wherein the at least one electrode comprises two or more electrodes, individual heights of the two or more electrodes substantially equal to one another.

10. The electronic device of claim 1, wherein an outermost horizontal boundary of the at least one electrode extends beyond an outermost horizontal boundary of a region including the additional electrodes.

11. The electronic device of claim 10, wherein an outermost horizontal boundary of the upper electrode extends beyond the outermost horizontal boundary of the region including the additional electrodes.

12. The electronic device of claim 1, wherein a surface area of an individual electrode of the at least one electrode is relatively greater than a surface area of the upper electrode.

13. The electronic device of claim 1, further comprising a substantially continuous portion of a conductive material extending within the at least one electrode, the additional electrodes, and the upper electrode.

14. The electronic device of claim 1, wherein the base material substantially surrounds individual electrodes of the at least one electrode on at least two consecutive sides.

15. The electronic device of claim 1, wherein portions of the additional electrodes extend beyond a lower surface of a lowermost electrode of the at least one electrode.

16. The electronic device of claim 1, wherein at least some of the additional electrodes comprise insulative support structures within central portions of the additional electrodes.

17. The electronic device of claim 1, wherein portions of the base material laterally intervene between neighboring additional electrodes.

18. An electronic device comprising:
one or more capacitors adjacent to a base material, the one or more capacitors comprising:
at least one electrode extending horizontally within the base material, the at least one electrode located below and isolated from an upper surface of the base material, wherein the at least one electrode comprises a first lower electrode and a second lower electrode, and a portion of the base material is located between the first lower electrode and the second lower electrode; and
additional electrodes extending vertically within the base material and contacting the at least one electrode.

19. The electronic device of claim 18, wherein a distance between the upper surface of the base material and the first lower electrode is about 300 nm and a distance between the upper surface of the base material and the second lower electrode is about 600 nm.

20. A method of forming an electronic device, comprising:
forming a sacrificial material extending horizontally within a base material, the sacrificial material below and isolated from an upper surface of the base material;
forming openings extending to the sacrificial material;
removing the sacrificial material within the openings; and
forming a conductive material adjacent to the upper surface of the base material and within the openings, the conductive material configured as gate electrodes of one or more capacitors, the one or more capacitors comprising:
at least one electrode extending horizontally within the base material, the at least one electrode located below and isolated from an upper surface of the base material;
additional electrodes extending vertically within the base material and directly physically contacting the at least one electrode; and
an upper electrode overlying the upper surface of the base material, the upper electrode directly physically contacting the additional electrodes with a major surface of the upper electrode substantially transverse to a longitudinal axis of the additional electrodes, portions of the base material vertically intervening between the at least one electrode and the upper electrode.

21. The method of claim 20, wherein forming the sacrificial material comprises forming a doped region within the base material, the doped region below and isolated from the upper surface of the base material.

22. The method of claim 20, wherein forming the openings extending to the sacrificial material comprises forming the openings extending vertically between the upper surface of the base material and the sacrificial material, and wherein removing the sacrificial material comprises forming additional openings extending horizontally within the base material.

23. The method of claim 22, further comprising forming a substantially continuous portion of a dielectric material along exposed surfaces of the base material within the openings and the additional openings and adjacent to the upper surface of the base material.

24. The method of claim 23, wherein forming the conductive material comprises forming a single conductive material adjacent to the dielectric material within the openings and the additional openings and adjacent to the upper surface of the base material in a single deposition act.

25. The method of claim 22, further comprising removing portions of the conductive material adjacent to the upper surface of the base material to form the upper electrode, the upper electrode having a width that is relatively less than a width of the conductive material within each of the additional openings.

* * * * *